United States Patent
McKenzie et al.

(10) Patent No.: US 8,212,273 B2
(45) Date of Patent: Jul. 3, 2012

(54) VERTICAL LED WITH CONDUCTIVE VIAS

(75) Inventors: James Stuart McKenzie, Falmouth (GB); Majd Zoorob, Southampton (GB)

(73) Assignee: PhotonStar LED Limited, Romsey (GB)

( * ) Notice: Subject to any disclaimer, the term of this patent is extended or adjusted under 35 U.S.C. 154(b) by 269 days.

(21) Appl. No.: 12/669,679

(22) PCT Filed: Jul. 18, 2008

(86) PCT No.: PCT/GB2008/002462
§ 371 (c)(1),
(2), (4) Date: Jan. 19, 2010

(87) PCT Pub. No.: WO2009/010762
PCT Pub. Date: Jan. 22, 2009

(65) Prior Publication Data
US 2010/0213485 A1    Aug. 26, 2010

(30) Foreign Application Priority Data
Jul. 19, 2007   (GB) .................................. 0714139.3
Sep. 3, 2007    (GB) .................................. 0717094.7

(51) Int. Cl.
*H01L 33/00* (2010.01)

(52) U.S. Cl. .......... 257/98; 257/E33.055; 257/E33.067; 257/E33.068; 438/29

(58) Field of Classification Search ........... 257/E33.055, 257/E33.067, E33.069
See application file for complete search history.

(56) References Cited

U.S. PATENT DOCUMENTS

| | | | |
|---|---|---|---|
| 5,917,202 A | 6/1999 | Haitz et al. | |
| 6,704,462 B1 | 3/2004 | Aas | |
| 6,784,462 B2 * | 8/2004 | Schubert | 257/98 |
| 6,797,987 B2 * | 9/2004 | Chen | 257/98 |
| 7,687,818 B2 * | 3/2010 | Yoon et al. | 257/98 |
| 2005/0087884 A1 * | 4/2005 | Stokes et al. | 257/778 |

(Continued)

FOREIGN PATENT DOCUMENTS

DE    10 2004 040277    2/2006

(Continued)

OTHER PUBLICATIONS

UK Examination Report of corresponding GB Application No. 0813275.5, dated Jul. 7, 2010.

(Continued)

*Primary Examiner* — Daniel Whalen
(74) *Attorney, Agent, or Firm* — Renner, Otto, Boisselle & Sklar, LLP

(57) ABSTRACT

A light emitting device comprises a novel low-loss array of conductive vias embedded in a dielectric multilayer stack, to act as an electrically-conductive, low-loss, high-reflectivity reflector layer (CVMR). In one example the CVMR stack is employed between a reflective metal bottom contact and a p-GaN semiconductor flip chip layer. The CVMR stack comprises at least (3) layers with at least (2) differing dielectric constants. The conductive vias are arranged such that localized and propagating surface plasmons associated with the structure reside within the electromagnetic stopband of the CVMR stack, which in turn inhibits trapped LED modes coupling into these plasmonic modes, thereby increasing the overall reflectivity of the CVM R. This technique improves optical light extraction and provides a vertical conduction path for optimal current spreading in a semiconductor light emitting device. A light emitting module and method of manufacture are also described.

18 Claims, 15 Drawing Sheets

U.S. PATENT DOCUMENTS

| | | |
|---|---|---|
| 2006/0033113 A1 | 2/2006 | Lee et al. |
| 2006/0033133 A1 | 2/2006 | Liu et al. |
| 2007/0001183 A1 | 1/2007 | Chen |

FOREIGN PATENT DOCUMENTS

| | | |
|---|---|---|
| DE | 10 2004 061865 | 3/2006 |
| EP | 1 646 092 | 4/2006 |
| EP | 1 769 540 | 4/2007 |
| EP | 1 794 816 | 6/2007 |
| GB | 2 451 334 B | 7/2011 |

OTHER PUBLICATIONS

UK Examination Report of corresponding GB Application No. 0813275.5, dated Jan. 10, 2011.

Notification of Grant of corresponding GB Application No. 0813275.5, dated Jun. 14, 2011.

Lee C.C. et al., "Light Extraction Enhancement of InGaN MQW by Reducing Total Internal Reflection through Surface Plasmon Effect," Proc. of SPIE, vol. 6337, Aug. 31, 2006.

Okamoto K et al, "Surface-plasmon-enhanced light emitters based on InGaN quantum wells," Nature Materials Nature Publishing Group UK, vol. 3, No. 9, Sep. 2004, pp. 601-605.

Scherer A et al, "Photonic crystals and their applications to efficient light emitters," LEOS 2001. 14TH Annual Meeting of the IEEE Lasers and Electro-Optics Society (CAT.No. 01CH37242) IEEE Piscataway, NJ, USA, vol. 2, 2001, pp. 736-737 vol. 2.

Ahmed N M et al, "Large enhancement of GaN-UV light emission using silver mirror resonator," Physica Status Solidi C Wiley-VCH Germany, No. 6, 2006, pp. 2022-2025.

Kamaev V et al, "Optical studies of 2D and 3D metallo-dielectric photonic crystals," Proceedings of the SPIE—The International Society for Optical Engineering SPIE—Int. Soc. Opt. Eng USA, vol. 5927, No. 1, 2005, pp. 592712-1.

Porta P A et al, "Surface plasmon mediated emission in resonant-cavity light-emitting diodes," Applied Physics Letters AIP USA. vol. 89, No. 12, Sep. 18, 2006, pp. 121120-1.

International Search Report of corresponding International Application No. PCT/GB2008/002462, dated Dec. 16, 2008.

UK Search Report of corresponding GB Application No. 0813275.5, dated Nov. 21, 2008.

UK Search Report of corresponding GB Application No. 0717094.7, dated May 22, 2008.

Yu Wang, "Surface Plasmon Tunable Filter and Flat Panel Display Device," Jet Propulsion Laboratory, California Institute of Technology, 1999.

* cited by examiner

Fig 1d
113
(a)
Fig 1e
(b)
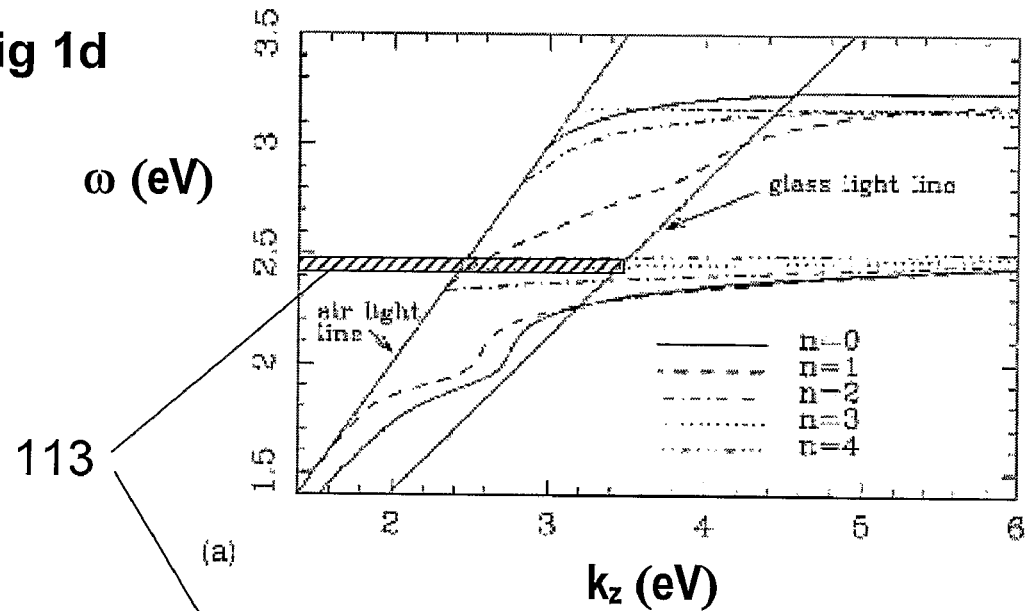
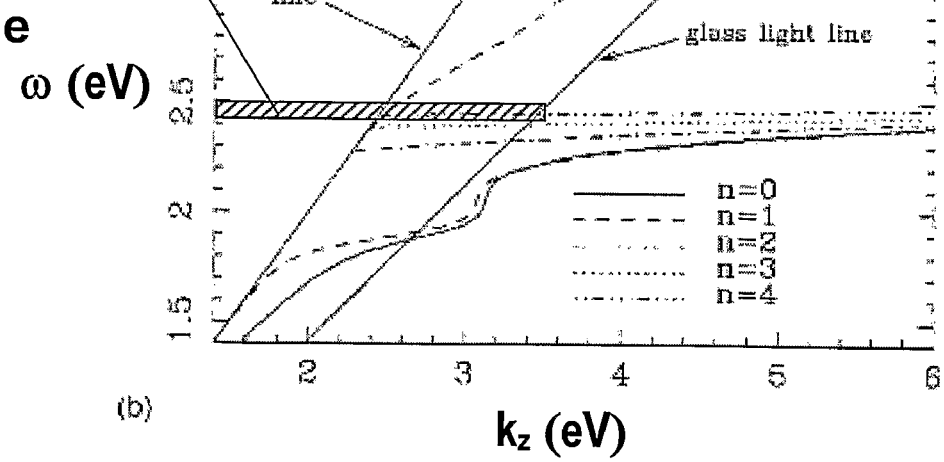

110
112

Bottom View

Bottom View

VERTICAL LED WITH CONDUCTIVE VIAS

This application is a national phase of International Application No. PCT/GB2008/002462 filed Jul. 18, 2008, and published in the English language.

FIELD OF THE INVENTION

The present invention relates to an improved vertical light emitting diode with low loss optical reflector.

BACKGROUND TO THE INVENTION

The light emitting diode (LED) is based on a forward biased p-n junction. LEDs have recently reached high brightness levels that have allowed them to enter into new solid-state lighting applications as well as replacements for high brightness light sources such as light engines for projectors and automotive car headlights. These markets have also been enabled by the economical gains achieved through the high efficiencies of LEDs, as well as reliability, long lifetime and environmental benefits. These gains have been partly achieved by use of LEDs that are capable of being driven at high currents and hence produce high luminous outputs while still maintaining high wall plug efficiencies. Solid state lighting applications require that LEDs exceed efficiencies currently achievable by alternative fluorescent lighting technologies.

The total efficiency of LEDs can be quantified by three main factors, namely internal quantum efficiency, injection efficiency, and extraction efficiency, the latter of these being a particular practical problem. However, injection efficiency and extraction efficiency are not entirely unrelated. For example, if an improvement in optical management can be achieved it may then be possible to accommodate larger ohmic contacts, thereby leading to improved injection efficiency.

One of the main limiting factors reducing the extraction efficiency in LEDs is the emitted photons being totally internally reflected and trapped in the high refractive index of the epi-material. Vertical light emitting diodes typically employ metal substrates and top contact regions. These characteristically introduce optical loss to trapped waveguide modes residing in the light emitting region. Current top surface roughening techniques are employed to extract the maximum amount of light on the first pass of light incident on the top surface. However, if light is multiply scattered by the bottom metal reflector then loss is introduced to the trapped waveguide mode. These trapped waveguide modes propagate in the LED structure until they are scattered, escape or reabsorbed. The thickness of the LED structure determines the number of modes that can be set up.

Many methods have been successfully employed to improve light extraction in LED heterostructures. These include shaping LED die, as described in U.S. Pat. No. 6,015,719 and U.S. Pat. No. 6,323,063, flip-chip mounting of LEDs as described by Wierer et al. in Appl. Phys. Lett., 78, Pg. 3379, 2001 as well as roughening of the top surface as taught by Schnitzer et al in Applied Physics Letters 63, 2174, 1993, and omnidirectional reflectors as suggested by Fink et al. in Science vol. 282, Pg. 1679, 1998. Other suggested methods include the use of periodic texturing on at least one interface of the structure to improve light extraction out of the light emitting region as suggested in U.S. Pat. No. 5,779,924.

To provide light emitting devices with high current and thermal driving capabilities the vertical type n-p contact configuration in GaN material systems has been recently adopted. Such examples have been disclosed in U.S. Pat. No. 6,884,646 and U.S. Patent 20060154389A1. However, one major drawback with such vertical type light emitting structures is the existence of optically lossy metal contacts in the close vicinity of the light emitting heterostructure. Trapped modes in the high index light emitting device typically undergo multiple internal reflections. The photons reflected at the interface between the metallic contact surface and the heterostructure material experiences large losses and hence reduces the total light output of the light emitting diode.

One of the fundamental ways to reduce optical losses in light-emitting devices is the employment of optical reflectors. Because multiple reflections occur in LED structures, mirror losses should be kept at a minimum by using reflectors with near-perfect reflection characteristics. Such near-perfect characteristics of a reflector include (i) high reflectivity, (ii) omni-directionality, (iii) broad spectral range of the high-reflectivity band and (iv) electrical conductivity for current-injected structures. There are several reflectors used in current LED structures including the metal reflector, the Distributed Bragg Reflector (DBR) and the Omni Directional Reflector (ODR).

Metal reflectors are electrically-conducting reflectors capable of reflecting visible light over a wide range of wavelengths and incident angles, i.e. showing omni-directionality and broad spectral width. However, total integrated reflectivity across all incidence angles of a metal reflector on a semiconductor is typically at most 96%. For example, Ag, which shows highest reflectivity among metals at visible wavelengths, exhibits normal-incidence mean reflectivity on GaN of 95.7% at 455 nm.

A DBR is a periodic structure with a unit cell of two dielectric layers having different refractive indices ni and quarter-wavelength thicknesses. A DBR can be designed to have a reflectivity as high as 99% at a certain centre wavelength for normal incidence. However, the DBR reflectivity depends on the incidence angle $\theta$ so that the stop band shifts towards shorter wavelengths for increasing $\theta$ without changing its spectral width. As a result, DBRs become transparent for oblique angles of incidence. In addition, the reflectivity of DBRs also depends on the polarization of the incident light. Therefore, the overall reflectivity, (TM mode+TE mode)/2, significantly decreases at oblique angles. Typically the number of layers needed is in the 10-50 range and therefore the applicability of DBRs in LEDs is limited due to the electrically insulating and thermally-resistant nature of dielectric layers.

In U.S. Pat. No. 6,784,462 the use of an omni-directional reflector (ODR) is proposed. This single dielectric electrically insulating layer is disposed between the light emitting region and the lower conductive region and having a plurality of electrical conductive vias contacting the lower light emitting region and an electrical contact. It is typically an object of vertical light emitting devices to provide good electrical and thermal conduction, a single dielectric layer will not provide true omni-directional reflectivity and angles residing within the escape cone formed between the light emitting medium and the dielectric layer will experience a reflection at the metal contact boundary which will introduce optical loss.

In Schubert et al APPLIED PHYSICS LETTERS 90, 141115, Apr. 6, 2007 a Conductive DBR structure is described using a single conductive material Induim Tin Oxide (ITO) deposited at an angle to provide both low and high refractive index layers (refractive index contrast 0.4), for the DBR and this achieved a theoretical reflectivity of 74%. This technique has the advantage of conductivity but at the expense of index contrast.

There are many applications for solid state lighting, and one of the largest emerging applications for this type of light emitting module is in the general lighting market. Solid state lighting offers many benefits over conventional lighting techniques such as incandescent, halogen and compact fluorescent lighting, and these benefits include small form factor, environmental, high efficiency, linearly dimmable, instant on, very long lifetime, tunable colour temperature, simple interface and control as well as capability of high switch speeds. Other markets that that already benefit from the advantages that solid state lighting offers include architectural, medical and signage applications.

Back Light Units (BLU) for LCD panels are key elements to the performance of an LCD panel. Currently most LCD panels employ compact cathode fluorescent light (ccfl) sources, however, these suffer from several problems such as poor colour gamut, environmental recycling and manufacture issues, thickness and profile, high voltage requirements, poor thermal management, weight and high power consumption. In order to alleviate these problems LCD manufacturers are implementing LED BLU units. These offer benefits in improved light coupling, colour gamut, lower power consumption, thin profiles, low voltage requirements, good thermal management and low weight.

Another application for LED modules is in light engines for front and rear projectors. Conventional High Intensity Discharge (HID) type projector light engines have always been hindered by large size, low efficiency and short lifetime resulting in slow adoption into consumer markets.

Thus, there are a wide range of applications for LED modules, if the problems limiting the efficiency can be alleviated. There is therefore a need for a more efficient design of LED, which can achieve the performance levels required for this type of solid state lighting device to replace more conventional sources.

SUMMARY OF THE INVENTION

According to a first aspect of the present invention, a light emitting device comprises:
 a first semiconductor layer having doping of a first type;
 a second semiconductor layer having doping of a second type;
 a light emitting region interposed between the first and second semiconductor layers;
 a first multilayer reflector stack disposed proximal to the first semiconductor layer and distal to the second semiconductor layer, the first multilayer reflector stack at least partially covering the first semiconductor layer;
 a first electrode disposed on the first multilayer reflector stack and at least partially covering the first multilayer reflector stack; and,
 a first network of electrically conductive elements disposed in the first multilayer reflector stack, the conductive elements of the first network extending at least partially through the first multilayer reflector stack to provide an electrically conductive path between the first semiconductor layer and the first electrode,
wherein:
 the first multilayer reflector stack is configured such that at least 60% of light that is generated in the light emitting region and that is incident on the first multilayer reflector stack is reflected;
 light generated in the light emitting region is extracted from the device through a surface of the second semiconductor layer; and,
 the first network of electrically conductive elements is configured such that light generated in the light emitting region that is incident on the first network of conductive elements is reflected and is forbidden to couple into localized or propagating surface plasmon modes associated with the first network of electrically conductive elements.

The present invention is directed to a vertical or flip chip light emitting device with a conducting substrate or carrier incorporating a low optical loss bottom reflector and low optical loss top contact.

In describing the present invention, reference is made to InGaN light emitting diodes by way of an example. However, implementation of the present invention may be in other light emitting material systems such as, but not restricted to, InGaAs, InGaP, AlGaP, InAlP, InGaN, InGaAlN, ZnO or any other III-V or II-VI semiconductor material.

In the present invention a novel low-loss array of Conductive Vias is embedded in a dielectric Multilayer (reflector) stack, referred to hereafter as a CVMR stack, to act as an electrically-conductive, low-loss, high-reflectivity reflector layer. This is typically employed between a reflective metal bottom contact and a p-GaN semiconductor flip chip layer. The CVMR stack comprises at least 3 layers with at least 2 differing dielectric constants.

The conductive vias are configured such that the localised and propagating surface plasmons generated by the resulting large-scale protruding surfaces reside within the electromagnetic stopband of the CVMR stack. This in turn inhibits trapped LED modes coupling into these (lossy) plasmonic modes associated with the conductive via structures and hence increases the overall reflectivity of the CVMR. Thus, the CVMR minimises the coupling of the trapped waveguide modes and those of the lossy metal reflector. This technique improves optical light extraction and provides a vertical conduction path for optimal current spreading in a semiconductor light emitting device.

Preferably, the dimensions and conductive via locations are arranged to reside above the diffraction limit and cut-off frequency (i.e. sub-wavelength gratings) to inhibit light coupling into surface plasmon polariton (SPP) modes associated with the conductive vias and introducing optical loss.

It is preferred that a refractive index of any of the first semiconductor layer, the second semiconductor layer and the light emitting region is greater than the lowest refractive index of material residing in the first multilayer reflector stack by a factor of at least 1.25. This level of refractive index contrast provides sufficient difference between the core LED structure and the CVMR stack to ensure that stray modes at higher angles of incidence on the CVMR are reflected rather than leaking away, as would be the case with known devices using DBR type reflector having a similar refractive index to the core LED structure.

Preferably, the device comprises a second CVMR stack near to the second semiconductor layer to reflect light and provide a conductive path to a second electrode.

It is preferred that a layer is disposed between the bottom CMR stack and the semiconductor material. This layer aids adhesion properties and also improves electrical conductivity.

It is further preferred that the top metal contact is disposed on top of the second CVMR stack to provide for reduced light attenuation from light emitted under the contact region. Preferably, the finite top contact region contributes to a minimum of around 1%, and more preferably around 5%, of the active top surface light emitting region and hence, if the light emerging from under these regions can be allowed to escape with minimum loss, then an increase in the total luminous output of the LED can be achieved. It is further preferred that the top contact region can be increased to 10%, 15% or 20% of the total top active area while still maintaining improved optical extraction, as compared to the prior art. The low loss reflectivity of the top contacts allows for maintenance of the trapped light and re-routing to regions of the LED device where efficient light extraction can take place. The increased top contact additionally improves current spreading of carriers into the quantum well region and thus in turn improves the injection efficiency into the overall LED device.

Preferably, a thin layer is disposed between the top CMR stack and the semiconductor material. This layer aids adhesion properties and also improves electrical conductivity.

The conductive vias embedded in the CVMR stack may comprise of an electrically conductive metal or an electrically conductive transparent metal oxide or nitride. The transparent metal oxide or nitride may also be doped to improved conductivity.

Additionally, the conductive vias comprise a conformal multilayer of conductive and insulating materials. An individual via may be a cylindrical via and may comprise a cylindrical shell of optically transparent insulating or conductive material surrounding a conductive metallic core and adjoined to the CVMR stacks. In a preferred embodiment the transparent cylindrical shell is of lower index than the effective index of the neighbouring CVMR stack materials.

In another preferred embodiment of the present invention, the multilayer via may also comprise of a metallic cylindrical shell surrounding an optically transparent material. This material may be electrically conductive, but can also be insulating. In the currently preferred example, the metallic cylindrical shell diameter and shell thickness is designed so that Bessel-type surface plasmon and confined modes associated with the metal cylinder reside in the electromagnetic stopband of the CVMR stack. This in turn inhibits trapped LED modes from coupling into plasmonic modes associated with the cylindrical shells and increases the overall reflectivity of the CVMR. Advantageously, the present invention employs metallic cylindrical shell vias for the high-speed modulation of LED devices. In recent trends in LED colour mixing, and for the enabling of efficient current driving, LED devices are being modulated at high speeds. As the modulation speed increases (>1 MHz) the carrier skin effect introduces A.C. resistance to the system and ultimately causes a drop in the efficiency of current injection through heat dissipation. By introducing metal cylindrical shell type vias these problems are drastically reduced.

Alternatively, the conductive vias comprise an array of metal vias and are a frusto porous colloidal network of metal vias penetrating partially into the CVMR stack. In another aspect of the invention the porous colloidal void metal reflector acts as an efficient retro-reflector.

The conductive vias may also comprise an array of elements connecting the semiconductor surface to the electrode layer and comprise of an arbitrary cross-sectional shape and taper angle. The sidewall of the cross sectional shape may be selected from the group of sidewalls comprising of straight, steep angled taper, shallow taper angle, double tapering, pinhead shaped, corrugated or curved sidewalls.

Preferably, the separation distance between the light emitting region and the bottom CVMR stack is optimised in order to achieve an optical cavity effect and maximise light extraction out of the top emitting surface of the light emitting device. Photons emitted directly from the light emission region of the LED are allowed to interfere constructively with photons reflected by the CVMR stack. The complex phase relationship of the CVMR stack is utilised in conjunction with the separation distance to optimise the resulting interference pattern inside the light emitting device in order to improve the light extraction efficiency.

In a preferred embodiment of the present invention, the bottom CVMR stack and metal contact are roughened to allow for increased scattering and reduced specular reflectivity. This provides an increased probability of trapped light to diffusely reflect and reside in the escape cone of the light emitting material, for example GaN. It is also beneficial that a diffuse surface between the light emitting region and the CVMR stack is introduced in order to eliminate coherent interference between directly emitted and reflected photons. The elimination of coherence allows the removal of sensitivity on the separation distance and allows greater flexibility on the material system employed in the CVMR stack whereby only the absolute magnitude of reflectivity of the CVMR stack can be solely utilised in the selection rather than the magnitude and phase of the reflectivity of the CVMR stack.

In another embodiment, the top CVMR stack and metal contact are roughened to allow for increased scattering and reduced specular reflectivity. This provides an increased probability of trapped light under the top metal contact to be diffusely reflected and redirected in the escape cone of the light emitting material, for example GaN In a further embodiment, the CVMR stack is randomly, periodically or aperiodically corrugated to form a non-specular reflection surface and promote scattering back into the LED structure. If the corrugations are larger than the effective wavelength of light the CVMR also acts as a retro-reflector.

Preferably, the bottom and top CVMR stack layers allows the light emitting device to be thinned down to a total thicknesses less than 3 μm. This allows the LED to achieve high extraction efficiency while still maintaining high current injection.

According to a second aspect of the present invention, a light emitting module comprises;
  a light emitting device according to the first aspect;
  a first encapsulating material disposed on at least the light extracting surface of the second semiconductor layer;
  a second encapsulating material overcoating at least the first encapsulating material; and,
  a phosphor material interposed between first and second encapsulating materials.

The light emitting module is formed by embedding a phosphor in an encapsulating material that resides on top of the light emitting device of the present invention. The encapsulation comprises of two layers of optically transparent environmentally resistant material. The first encapsulation material, which is disposed proximal to the light emitting device, is formed of a high refractive index material and is textured or shaped to extract the maximum number of photons. The phosphor is subsequently disposed on the high refractive index encapsulant while another encapsulation material distal to the light emitting device is disposed on the top of the phosphor. The distal encapsulant is also shaped to provide the desired far field emission out of the light emitting module.

According to a third aspect of the present invention, a method of manufacturing the light emitting device of the first aspect, or the light emitting module of the second aspect, comprises the steps of:
  growing each of a second semiconductor material, a light emitting region, and a first semiconductor material;
  depositing a first multilayer reflector stack;
  forming a first mask for producing a first network of conductive elements;

performing a pattern transfer of the first network using the first mask into the first multilayer reflector stack, wherein the pattern is configured such that light generated in the light emitting region during operation and that is incident on the first network of conductive elements is reflected and is forbidden to couple into localized or propagating surface plasmon modes associated with the first network of electrically conductive elements;

depositing the first conductive elements;

forming mesa isolation trenches to define light emitting devices;

depositing a passivation layer;

depositing a first electrode;

attaching a conductive sub-mount;

removing growth substrate;

depositing a second electrode;

roughening an outer surface of the second semiconductor layer, separating out an isolated light emitting die.

Preferably, a refractive index of any of the first semiconductor layer, the second semiconductor layer and the light emitting region is selected to be greater than the lowest refractive index of material residing in the first and/or second multilayer reflector stack by a factor of at least 1.25.

The method may further comprise the step of depositing a first high reflectivity metal for the first multilayer reflector stack after the step of depositing the first conductive elements. It is also preferred that the method further comprises the step of depositing a first transparent layer prior to the step of depositing the first electrode.

After the step of removing growth substrate the method may further comprise the steps of:

depositing a second multilayer reflector stack;

forming a second mask for producing a second network of conductive via elements;

performing a pattern transfer of the second network using the second mask into the second multilayer reflector stack, wherein the pattern is configured such that light generated in the light emitting region during operation and that is incident on the second network of conductive elements is reflected and is forbidden to couple into localized or propagating surface plasmon modes associated with the second network of electrically conductive elements; and, depositing the second conductive elements.

Preferably, the method then further comprises the step of depositing a second high reflectivity metal for the second multilayer reflector stack after the step of depositing the second conductive elements. The method may also comprises the further step of depositing a second transparent layer prior to the step of depositing the second electrode.

The step of pattern transfer may be performed using at least one technique selected from a group which includes photolithography, UV lithography, deep UV lithography, X-ray lithography, non-photolithographic techniques, anodized metal oxide templates, anodized aluminum oxide, block copolymer templating, and nanoimprinting.

In a first embodiment, the method of manufacture of the conductive via elements comprises the use of a photolithographic, UV, deep UV or x-ray lithography technique to define the location of the via elements. In a preferred embodiment, the method of manufacture produces non-photolithographically defined conductive vias in a CVMR stack by employing nano-imprinting, anodised aluminium oxide (AAO), block copolymer templating, or other similar technique.

BRIEF DESCRIPTION OF THE DRAWINGS

FIGS. 1d and 1e show the surface Plasmon dispersion modes for an embodiment of the conductive via;

DETAILED DESCRIPTION OF THE INVENTION

Figure 1A:
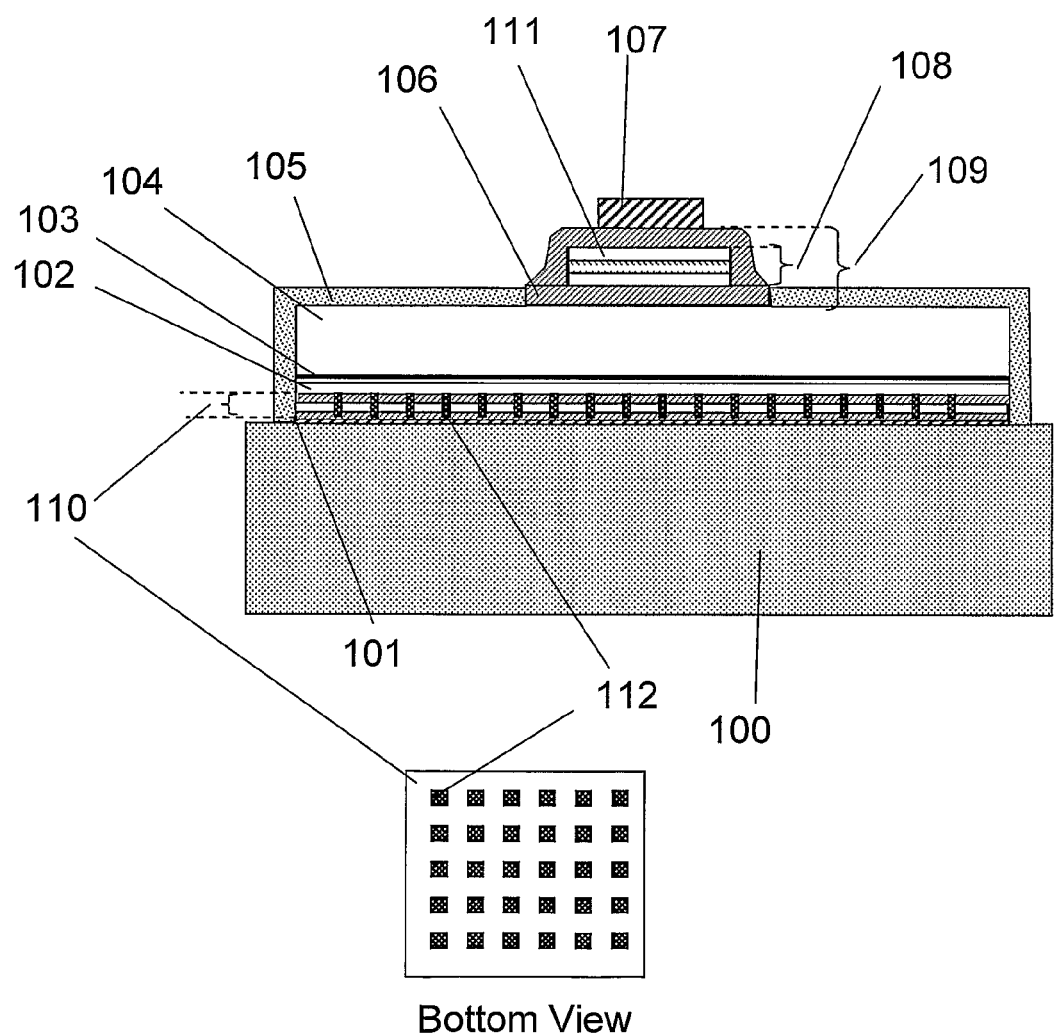
FIG. 1a shows a cross section of an example of the light emitting device of the present invention, and the insert highlights a bottom view of the metal via arrangement.

The object of the present invention is to provide high wall plug efficiency light emitting devices by improving both the light extraction efficiency as well as the injection efficiency. The invention can be incorporated in a light emitting device of any semiconductor material system such as, but not restricted to, InGaN, InGaP, InGaAs, InP, or ZnO. A GaN based LED having an epitaxial layer formed on a sapphire substrate is used as an example in the present invention. However, the current invention is not restricted to epitaxial layers grown on sapphire and may include Si, SiC, Ge, native free-standing GaN, AlN or any other growth and substrate technology.

GaN light emitting devices comprise of a p-n junction heterostructure of refractive index about 2.45. When the light emitting device is forward biased spontaneously emitted photons are generated. If the wavevector of the photon resides below the light line (in a frequency-wavevector diagram) of the material the photon is totally internally reflected and trapped in the high refractive index of the epi-material.

Table 1 lists the approximate multiplicative extraction enhancement factors for the different techniques commonly employed to extract light from the top surface of an unpackaged vertical GaN LED. The numbers describe the multiplicative factor above a reference bare unroughened light emitting device. The numbers are based on an example structure whereby the mirror is assumed to be 100% reflective and the location of the multiple quantum well (MQW) is optimised to direct most of the light within the light line of the structure and achieve a cavity type effect. Only about 4.35% of the light is extracted out of the top surface of a bare unroughened LED. The calculation assumes that the GaN possesses a refractive index of approximately 2.45.

TABLE 1

| Extraction technique | Extraction enhancement |
|---|---|
| Mirror | x2.0 |
| Microcavity | x1.75 |
| Roughening techniques | x2.5 |

The present invention aims to provide an electrically-efficient, vertical, flip-chip, thin-film light emitting device with a reflecting conducting substrate, or carrier, incorporating a low optical loss bottom reflector and low optical loss top contact. The incorporation of low loss conductive reflectors on the bottom and top contacts allows trapped modes to propagate in the high index light emitting device until they are efficiently extracted by the top surface texturing or by the edge facets. The reflectors comprise a CVMR stack that is designed to efficiently reflect incident light while still maintaining high current injection efficiency.

In the first embodiment of the invention a novel low loss bottom CVMR stack, 110, is employed between the reflective metal bottom contact, 101, and the p-GaN flip chip layer, 102. This is indicated in FIG. 1. The layer 101 can also comprise a multilayer of electrical and thermal conducting metals optimised for maximal adhesion and highest optical reflectivity. Layer 101 can comprise, but is not restricted to, single or multilayers of 5 to 15 nm of Ni, Cr, Pt, Ti or Ru for adhesion, while additional multilayers of Al and Ag can be employed for improved reflectivity at wavelengths in the UV and blue region. Additionally, layers such as, but not exclusively, Cu or Ag may also be employed for improved bonding with the underlying substrate.

The layer 101 resides on top of a conductive substrate 100 which also acts as the bottom p-contact. The CVMR comprises at least 3 material layers, and can comprise 4 layers, 5 layers or more. The at least 3 material layers comprise of at least 2 different dielectric constant materials. Embedded in the bottom CVMR stack are multiple conductive metal vias that extend and electrically conduct between the metal p-contact region 100 and layer 102. The conductive vias are evenly distributed to maximise current density distribution into the p-GaN region.

The materials of the layers in the CVMR stack are selected and stacked to maximise the dielectric contrast between neighbouring layers and hence materials with alternating low and high refractive indexes are employed in the same stack. The reflectivity characteristics of the stack can be analysed by using the transfer matrix method or other similar modeling technique. The CVMR can comprise any combination of multilayer stack design. It is an aim of the invention to implement a high-reflectivity multilayer stack that can reflect the largest percentage of trapped modes without introducing optical loss. Some examples of possible multilayer stack configurations are Omni-directional reflectors, periodic, aperiodic, binary, rugate, graded index or quasiperiodic structures.

It is preferred that the CVMR multilayer stack possesses a wide optical bandgap that is centred at the light emission wavelength. The bandgap is designed to operate both for TE and TM polarised light and across all angular wavectors of light incident from the high refractive index GaN material and across the complete bandwidth of the light emission. It is also desirous to avoid coupling into spurious defect modes (such as at the Brewster angle) that light may couple into at specific angles. This may be also achieved by breaking the symmetry of the incident or multilayer stack mode.

Figure 5A:
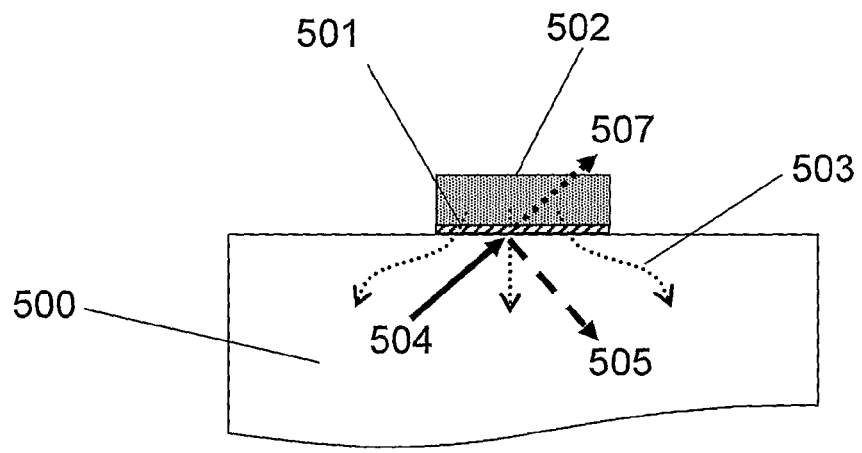
FIG. 5a illustrates loss experienced by trapped photons incident on a top surface metal contact in a known device.

As shown in FIG. 1, extending through the optically transparent layers is an array of vias (or ohmic contacts) configured in a regular pattern, for example, although other patterns are possible. These vias provide a low resistance electrical contact with the semiconductor. The Ohmic contacts or vias 112 for electrical conduction to the p-type semiconductor may comprise Ni—Au or AuBe or AuZn or Ni—Al—Ti—Au or Ru—Au, for example, although other materials may be used. As shown in FIG. 1 the vias 112 comprise a small fraction of the interface area between the reflective stack 110 and the semiconductor. Ohmic contact vias comprise about 0.25%, 0.5%, 1%, 21% or about 25% of the interface area of the CVMR. This small ohmic contact area reduces the light absorption when compared to the prior art arrangement, as shown in FIG. 5a.

Determining the Power Reflectivity of the CVMR Stack

The transfer matrix method for calculating the reflectivity of a CVMR stack is described as follows. Firstly, the transmission and reflection of a single layer in the stack is determined as follows:

$$\begin{pmatrix} E_{i-1} \\ H_{i-1} \end{pmatrix} = M_i \begin{pmatrix} E_i \\ H_i \end{pmatrix} \quad (1)$$

where E and H, respectively, represent the Electric and Magnetic field residing in the stack, and $M_i$ represents the transformation matrix for the i-th layer in the stack. The transformation matrix is given by:

$$M_i = \begin{pmatrix} \cos(k_i d_i) & -jZ_i\sin(k_i d_i) \\ \frac{-j\sin(k_i d_i)}{Z_i} & \cos(k_i d_i) \end{pmatrix} \quad (2)$$

where the wave-vector is defined as $k_i = 2\pi n_i/\lambda$, the electromagnetic impedance $Z_i$ is defined as $Z_i = Z_o/n_i$ and $d_i$ is the layer thickness In equation (2) j represents the imaginary unit, to distinguish from layer number i. An angle $\theta_i$ defines the propagation angle of the wavevector in the i-th layer. To determine the reflection and transmission of the complete CVMR stack with N layers the product of the transformation matrix of all the layers is calculated, as follows:

$$M = \prod_{n=1}^{N} M_n = M_1 \times \ldots \times M_N = \begin{pmatrix} m_{11} & m_{12} \\ m_{21} & m_{22} \end{pmatrix} \quad (3)$$

If the two previous equations are combined to determine the transmission and reflection of the complete CVMR stack, the following equation is derived:

$$\begin{pmatrix} E_1 \\ H_1 \end{pmatrix} = M \begin{pmatrix} E_N \\ H_N \end{pmatrix} = \begin{pmatrix} m_{11} & m_{12} \\ m_{21} & m_{22} \end{pmatrix} \begin{pmatrix} E_N \\ H_N \end{pmatrix} \quad (4)$$

Finally, the power reflectivity of the CVMR stack is given by:

$$R = \left| \frac{Z_{N+1}m_{11} + m_{12} - Z_1 Z_{N+1} m_{21} - Z_1 m_{22}}{Z_{N+1}m_{11} + m_{12} + Z_1 Z_{N+1} m_{21} + Z_1 m_{22}} \right|^2 \quad (5)$$

The transparent materials in the bottom CVMR stack may comprise multilayers of optically transparent dielectrics commonly employed for optical coatings. These can include materials such as Silicon Nitride or Silicon Dioxide, metal oxides, nitrides or oxynitrides such as those derived from the following metals Al, Hf, Ta, Ti, Cr, Zr and Si. Other possible materials include transparent conductive materials such as, but not limited to ZnO, Indium Tin Oxide (ITO), Indium, Gallium or Aluminium doped Zinc Oxide (IZO, GZO and AZO), Aluminium Nitride (AlN), Titanium oxide, TiN, TaN, GaN or Carbon Nanotubes (CNT) or transparent conductive metal oxides including those with a spinel crystal structure, as well as transparent conductive metal nitrides. Such materials typically possess high refractive indexes of approximately 1.6 to 2.45 and provide good candidates for the high refractive index layers in the CVMR stack. The value of the high refractive index material can also exceed that of the light emitting region, for example up to 2.6, or up to 2.8.

For the low refractive index layers the following materials may be employed: dielectric materials such as MgF2, CaF2, and SiO2, nanoporous or nanorod dielectrics such as nanorod SiO2 (with a refractive index as low as 1.05), transparent dielectrics, metal oxides or nitrides or oxyntrides with higher porosity such as ITO nanorods, GaN nanocolumns, AlN nanocolumns, ZnO doped with Silicon or Magnesium Fluoride can be deposited providing low refractive indexes of around 1.3. Transparent polymers and transparent conductive polymer materials can also be used, some examples of these are poly(ethylenedioxythiophene): poly(styrenesulfonate) (PEDOT:PSS) or polyaniline: poly(styrenesulfonate) (PANI: PSS), having refractive indexes about 1.5. The values of the low refractive index material can reside between air (refractive index 1.0) and that of the index of the light emitting material, which is 2.45 in the case of GaN. It is also possible to employ materials with a negative refractive index.

The multilayer stack can be designed to possess a wide optical bandgap that is centred at the light emission wavelength. The bandgap is designed to operate both for TE and TM polarised light and across all angular wavectors of light incident from the high refractive index GaN material and across the complete bandwidth of the light emission. The dispersion modes of the multilayer stack is also analysed to avoid coupling into spurious defect modes (such as at the Brewster angle) that light may couple into at specific angles. Once the multilayer stack is optimised the introduction of the conductive vias is also modeled and assumed to reside in an effective index medium determined from the TMM analysis.

In a preferred embodiment of the present invention, the CVMR stack is designed to reflect at least 60%, 70%, 80%, 90%, 95%, 96%, 97%, or 98% of the incidence light for both polarisations and for all incident angles.

Determining the Surface Plasmon Modes Residing in the Metal Vias

In order to determine the dispersion relations for the vias, Maxwell's equations in cylindrical coordinates (r, θ, z) are solved, as follows:

$$E_r = \left( \frac{ik_z}{k_j} a_n^j f_n^{j'}(k_j r) - \frac{\omega n}{k_j^2 r} b_n^j f_n^j(k_j r) \right) S_n \quad (6)$$

$$E_\theta = \left( -\frac{nk_z}{k_j^2 r} a_n^j f_n^j(k_j r) - \frac{i\omega n}{k_j} b_n^j f_n^{j'}(k_j r) \right) S_n \quad (7)$$

$$E_Z = a_n^j f_n^j(k_j r) S_n \quad (8)$$

$$H_r = \left( \frac{n\varepsilon_j \omega}{k_j^2 r} a_n^j f_n^j(k_j r) - \frac{ik_z}{k_j} b_n^j f_n^{j'}(k_j r) \right) S_n \quad (9)$$

$$H_\theta = \left( \frac{i\varepsilon_j \omega}{k_j} a_n^j f_n^{j'}(k_j r) - \frac{nk_z}{k_j^2 r} b_n^j f_n^j(k_j r) \right) S_n \quad (10)$$

$$H_Z = b_n^j f_n^j(k_j r) S_n \quad (11)$$

where i is the imaginary unit, $a_n^j$ and $b_n^j$ are the complex coefficients and n is an integer (n=0, 1, . . . ) defining the order for the Bessel function and the general solution is a superposition of these for all n. Maxwell's electric and magnetic fields are defined in Bessel form to represent the cylindrical nature of the vias. The z component of the wave vector $k_z$ is the component where z is the direction along the cylinder axis. $\varepsilon_j$ is the dielectric relation for medium j and is typically frequency dependent. For the vias, medium j typically constitutes of s=surrounding multilayer effective medium, m=metal layer and c=transparent core medium.

Additionally, the exponential factor $S_n$ is defined as $S_n = e^{i(n\theta + k^z z - \omega t)}$ and the wave vector $k^j$ is defined as $k_j \sqrt{\varepsilon_j (\omega/c)^2 - k_z^2}$. Also $f_n^j(k_j r)$ and $f_n^{j'}(k_j r)$ identify the function and it's derivative comprising of a linear combinations of modified or ordinary Bessel functions employed depending on layer j and its location in the via.

In order to solve the set of linear equations, the boundary condition at the interface between each layer along the cylindrical axes of the vias is solved. Matching the field components derives the values for $a_n^j$ and $b_n^j$ and subsequently the eigenmodes of the cylinder vias. This procedure is general and provides a means of solving both plasmon modes as well as possible waveguide modes trapped in the electrically conductive vias. Typically only non-radiative modes can be examined using this current model, which are also the most lossy modes in the current CVMR stack.

Figure 1B:
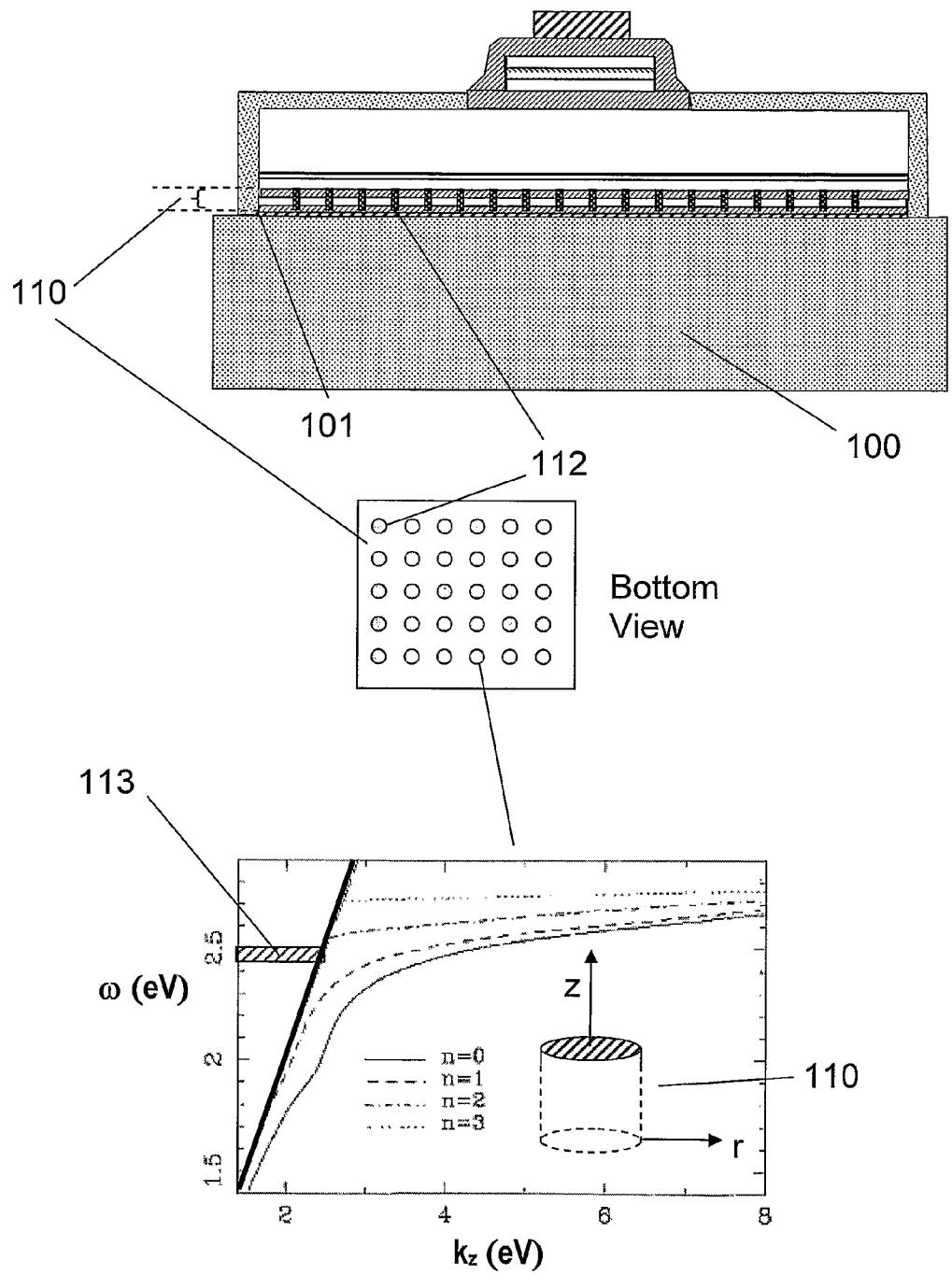
FIG. 1b illustrates the surface Plasmon modes residing on the conductive vias.

The dispersion relation for a typical single via structure is demonstrated in FIG. 1(b). The figure demonstrates the first 5 dispersion modes propagating along an exemplary single sold gold via of diameter 100 nm residing in a background dielectric medium of refractive index 1.0. As can be seen the first n=0 mode tends toward ω=0 while also approaching the light line. This implies that a high frequency optical wavelength will not couple into such a zero order mode. It is more important to track the higher order modes as these intersect the light line (solid straight line in FIG. 1b) with finite angular frequency and hence the effective index of the background medium as well as the dimensions of the gold via are very critical in shifting the dispersion intersection away from the angular frequency of the incident light trapped in the LED thus eliminating any light coupling into lossy modes. The finite bandwidth, 113, of typical emission from a blue LED device is schematically demonstrated in FIG. 1b. In this example no incident light from an exemplary LED structure would couple into the allowed surface plasmon modes of the metal via and hence would all be reflected as if they were incident on a planar metallic surface.

It is noted that the conductive via elements that are embedded in the CVMR stack may comprise of electrically conductive metals, multilayers of metals or alternatively an electrically conductive transparent metal oxide or nitride. The transparent metal oxide or nitride may also be doped to improve electrical conductivity.

Figure 1C:
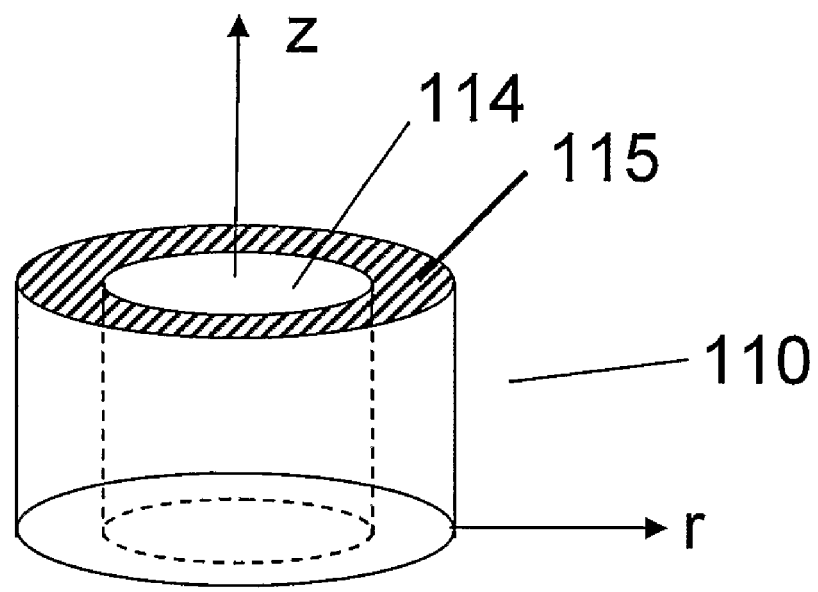
FIG. 1c shows a schematic diagram of two embodiments of the conductive via.
Figure 1C:
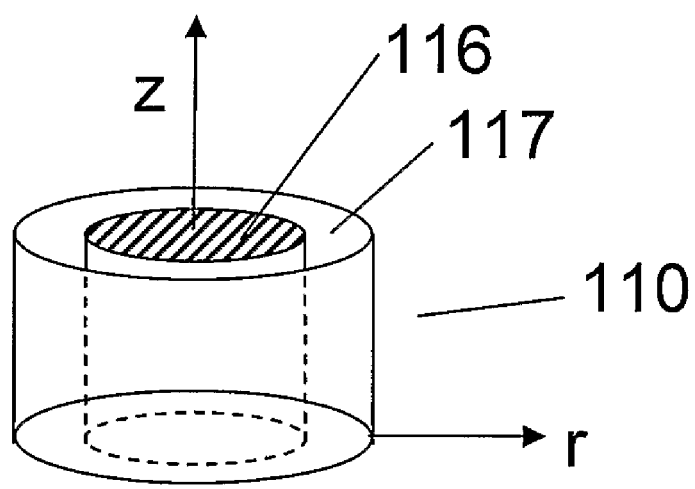

In a second embodiment of the present invention the vias may comprise a metal shell, 115, surrounding a dielectric core, 114. In FIG. 1c an exemplary structure is highlighted. The addition of another 2 degrees of freedom, in this case the inner core radius of the dielectric medium and its refractive index, allows for greater flexibility in shifting the surface plasmon modes away from the incident wave-vectors of the LED device. By fixing the inner core (80 nm with dielectric core refractive index of approx. 2.0), and reducing the outer radius of metal+dielectric from approximately 110 nm to 100 nm, the dispersion relations shift is clearly visible as shown in FIGS. 1d and 1e, respectively.

It is also an advantage of the present invention to employ metallic cylindrical shell vias for the high speed modulation of LED devices. Recent trends in LED colour mixing involve the use of modulated Red, Green and Blue LEDs to achieve the desired colour.

Additionally, for the enabling of efficient current driving, and reduced LED driver costs as well as improved driver lifetime the LED devices are being modulated at high speeds. As the modulation speed increases (>1 MHz) the carrier skin effect introduces a.c. resistance in the system. This a.c. series resistance in the LED device adversely affects the overall wall plug efficiency of the LED. Additionally, the increased resistance introduces heat dissipation and hence ultimately requires unnecessary thermal management. By introducing arrays of isolated metal cylindrical shell type vias these problems are drastically reduced.

In one embodiment of the invention, the vias can also comprise a metal core, 116, surrounded by a dielectric shell 117. In this case the dielectric layer, 117, is designed to posses a lower refractive index than the average effective index of the CVMR stack, thus allowing for improved reflectivity and reduced loss from the metal via core, whereby $$n_{dielectric\ layer\ 117} < n_{effective\ CVMR\ 110} \quad (12)$$

Once the dispersion of the plasmon modes of the vias is analysed these are overlapped with the multilayer stack dispersion modes and optimised so that the bandgap created at the emitted wave vectors of the LED device is maintained and overlaps for both optical elements in order to generate an efficient and highly reflective CVMR stack.

Figure 1F:
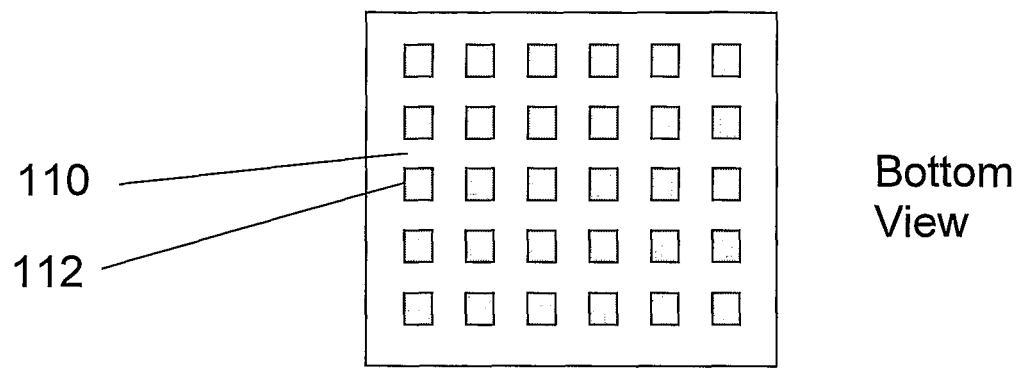
FIGS. 1f to 1j show a bottom view schematic of other embodiments of conductive via arrangements.
Figure 1G:
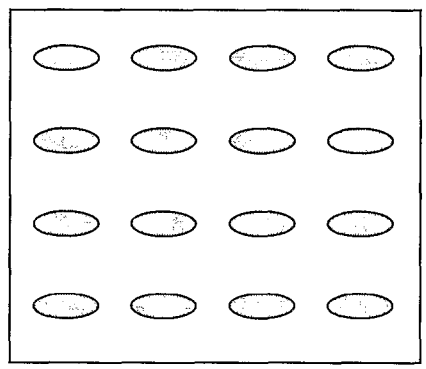
Figure 1H:
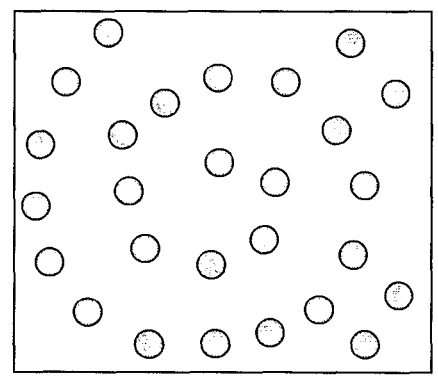

The conductive vias can be positioned to coincide on any periodic, aperiodic, amorphous or random arrangement, with the aim being to optimise the current spreading efficiency while minimising optical loss from absorption by the lossy conductive metal materials. The shapes of the conductive vias can also be varied and may include square, triangular, circular, elliptical and cross shaped, although other shapes are possible. FIGS. 1f, 1g and 1h show exemplary arrangements of differently shaped via holes namely square, elliptical and circular, respectively. Additionally, the cross-section of the conductive via elements may comprise of any arbitrary shape and taper angle and may include, but not limited to, straight sidewalls, steep angled tapers, shallow angle tapers, double tapered sidewalls, pinhead shaped cross sections, corrugated or curved sidewalls. Also as shown in FIGS. 1f, 1g and 1h, the differently shaped via holes are defined, respectively, along a square lattice, a rectangular lattice and an outwardly expanding Archimedian spiral.

Figure 1I:
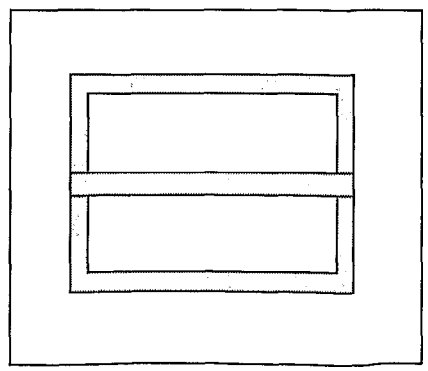
Figure 1J:
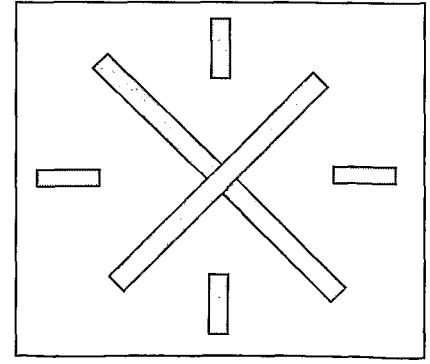

It is also possible for the conductive vias to comprise of high aspect ratio elongated elements. These elongated via elements may also be joined to form complex geometrical shaped also optimised for maximal current spreading and minimal optical loss. FIG. 1i shows an array of joined conductive tracks embedded in the CVMR stack. In FIG. 1j an exemplary complex arrangement of joined and isolated elongated conductive via tracks is demonstrated.

Figure 1K:
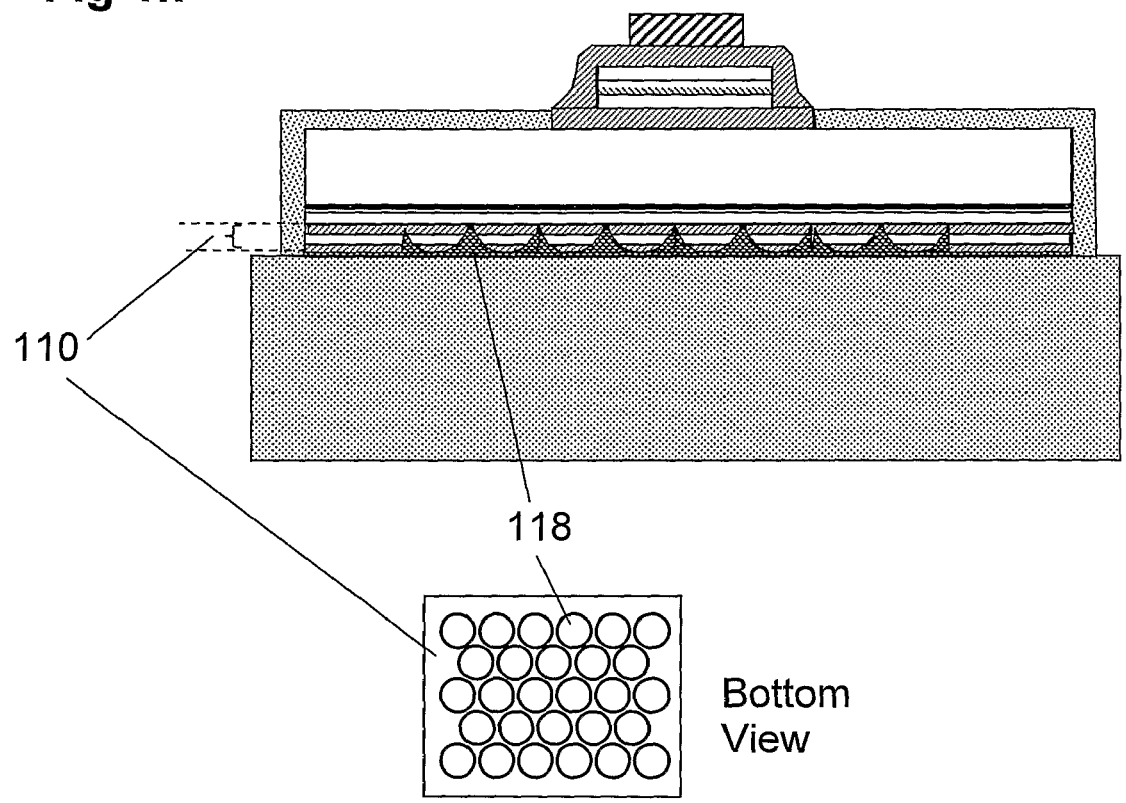
FIGS. 1k and 1l show a cross section view of another embodiment of vias comprising of macroporous colloids.
Figure 1L:
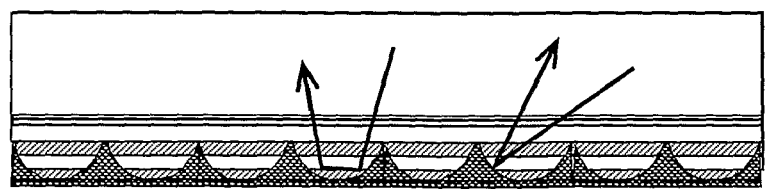

Additionally, the via shapes can also comprise of a complex 3D network, such as a frusto spherical porous colloidal network of metal vias partially or fully penetrating into the CVMR stack. This complex network can be fabricated using electrochemical colloidal templating techniques as well as chemical oxidation steps. This is shown in FIG. 1k where a colloidal template is employed to define the location of the macroporous metallic network 118, which electrically connects between layers 101 and 102. Such a complex structure can also provide efficient retro-reflector type behaviour, as shown in FIG. 1l, due to the concave void-like nature of the metallic reflector. This in turn helps improve the light extraction capability out of the top surface of the LED device.

In order to determine the approximate diameters of the metal vias the approximate transmittance of a surface plasmon around a circular metal disc is determined. A metal via radii is selected with maximum radiative transitions and minimum transmittance. The modes for a curved metal disc with a dielectric surrounding medium can be determined by the following equation:

$$0 = \frac{1}{k_{metal}} \frac{J'_n(k_{metal}r)}{J_n(k_{metal}r)} - \frac{1}{k_{dielectric}} \frac{H^{(1)'}_n(k_{dielectric}r)}{H^{(1)}_n(k_{dielectric}r)} \quad (13)$$

where $H_n^{(1)}$ and $H_n^{(1)'}$, respectively, are the Hankel transform of the first kind and its derivative. The real and imaginary mode index {n} of the resultant propagating surface plasmon mode is solved, where m is defined as the fundamental mode. Using these values an upper bound for the transmittance of the surface Plasmon modes can be calculated using the following expression:

$$T \approx \frac{|mkr|^2}{|m + kr|^4} \quad (14)$$

This calculation also assumes that the metal is lossless and hence is advantageous in providing the upper bound to the problem. Using such an expression it is determined that, down to approximately 100 nm radius, Silver vias embedded in a CMR with an approximate effective index of 1.4 (approximately giving a maximum T~5% light coupling into any surface plasmon mode associated with the via) offer substantial reflection and radiative scatter off the metal vias surface. It is also determined that the low transmittance is maintained until approximately 3 μm. A temporary increase in the transmittance is experienced between diameters around 3 μm and around 5 μm. In another preferred region of operation, metal via diameters greater than 5 μm are preferred.

In an example of the present invention, solid metal vias of approximately 10 μm, 20 μm, 50 μm, 100 μm, or 200 μm are employed. The vias typically use approximately 0.1%, 0.5%, 1.0%, 5.0%, or 10% of the total area of the CVMR stack. In the case of the frustro-spherical porous network, approximately 47.6% of the CVMR stack is occupied by the metal network.

In the second embodiment of the present invention, the metal shell of the metal via is designed to approximately relate to multiples of the skin depth of the metal at the light emitting wavelength. In the case of an example with Silver metal cylinders, approximately 15 nm, 30 nm, 45 nm 60 nm, or 150 nm thickness is deposited. In the example of Aluminium metal cylinders, approximately 6 nm, 12 nm, 24 nm, or 60 nm of metal is deposited. Finally for the example of Gold metal cylinder vias, approximately 24 nm, 48 nm, 72 nm, 96 nm, or 120 nm is utilised.

In an example of the present invention where a dielectric shell is allowed to coat the metal via, the thickness of the dielectric shell is designed to be an approximate multiple of half of the wavelength of the emitted light. This is in order to improve the reflectivity of each individual via. In the case of an $MgF_2$ coating (where n~1.38), a thickness of approximately 165 nm, 330 nm, or 495 nm around the metal via is preferred. In the case of Silicon Dioxide (where n~1.46), approximately 156 nm, 312 nm, or 467 nm is optimal.

The vertical type light emitting device structure further comprises a doped semiconductor material, in the current example an n-type GaN layer, 104, as well as the light emitting region which may comprise of a single or Multiple Quantum Well region, 103, sandwiched between a semiconductor material of a different doping, in the current example p-type GaN layer 102, and that of layer 104.

In another example of the invention the top multilayer metal n-contact region, 107, is deposited on top of a conductive multilayer reflector (CMR) stack region, 109. The multilayer of metal can comprise a thin adhesion layer to reduce contact resistance followed by a reflective metallic layer followed by a metallic electrode. This is incorporated to provide reduced photon absorption and total light output attenuation from the light emitted under the top contact region. The finite top contact region contributes to a minimum of around 50%, 25%, 10%, 5%, 3% or 1% of the active top surface light emitting region and hence, if the light emerging from under these regions can be allowed to escape with minimum loss, then an increase in the total luminous output of the LED can be achieved.

The top CMR stack, 109, can comprise similar transparent materials as the bottom CVMR stack 110. However, another object of the present invention is to provide a CMR stack of mainly dielectric materials, 108, with a conductive material, 106 for current spreading purposes. The layer 108 comprises at least 3 material layers, and preferably at least 4 or 5 layers. The 108 multilayer is optimised for maximum omnidirectional reflectivity while the layer 106 is selected for optical transparency and maximal electrical conductivity. Layer 106 can comprise of similar materials selected for use in CVMR 110, while for multilayer 108 a much wider selection of optically transparent dielectrics commonly employed for optical coatings can be selected. This may include, but is not limited to, Silicon Nitride or Dioxide, or metal oxides, fluorides, nitrides or oxynitrides such as derived from the following metals Al, Hf, Ta, Ti, Mg, Si, Cr, Zr.

The final light emitting device is surrounded by a passivation layer, 105, to protect the GaN material from the environment and from oxidation. The passivation material can comprise but not limited to Silicon Dioxide, Silicon Nitride or a polymer layer.

In another example of the invention there exists a thin layer disposed between the bottom CMR stack and the semiconductor material. This is to aid adhesion properties and also improve electrical conductivity. This layer is optimised to be transparent or comprise of metal of only a few nanometers in thickness. This layer can comprise, but is not limited to, any of ITO, IZO, ZnO, Carbon nanotubes, Ni/Au, Pt, Cr, Ti, W, Ru.

Figure 2A:
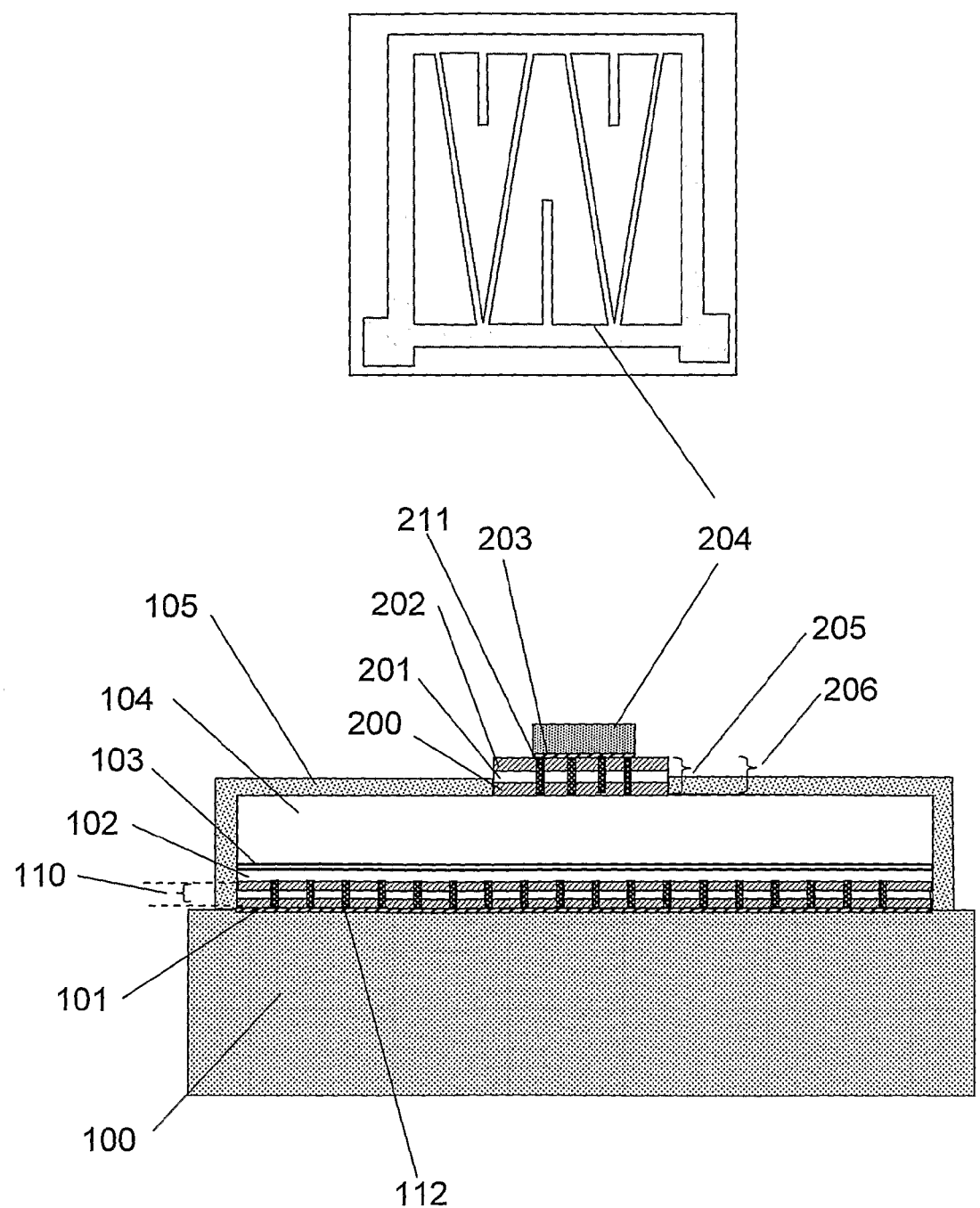
FIG. 2a shows a cross section of a second example of the light emitting device of the present invention.

In another example of the invention the top CMR stack can be replaced by a CVMR stack, 206, as shown in FIG. 2a. This can comprise transparent materials similar to those used for stack 110, while also incorporating metal vias 211. The CVMR stack 206 is designed and constituent materials are selected in a similar way to the bottom CVMR stack 110. In the example described in FIG. 2, a 3 layer multilayer stack is implemented. The first layer 200 can, for example, comprise a low refractive index material such $MgF_2$, $CaF_2$, nanorod ZnO, nanorod ITO and Silicon Dioxide. The thickness and selection of each layer is optimised to provide maximal reflection of incident photons back into the GaN material for all wavevectors. The metal vias 211 provide a low resistance electrical contact with the n-type semiconductor and may, for example, comprise a metal composition such as AuGe—Ni—Au, or Cr—Pt—Au or Ti—Pt—Au or Ti—W or Ni—Ti—Al—Au, but other compositions are possible. In the case of this example, the top n-type contact 204 is deposited on top of a thin metal layer 203, which will perform similar functions to layer 101 in terms of improved adhesion, electrical conductivity and high optical reflectivity and hence will employ similar metals.

As an outcome of the low loss reflective top electrodes, the present invention aims to increase the percentage coverage of the top electrodes to allow for improved current injection when high current density LED operation is required. The top electrode density is thus increased to 5%, 10%, 15%, or 20% of the total top active surface of the LED device. The increased density will allow improved current spreading along the n-GaN layer maintaining high injection efficiency even at high drive current of 1 A, 1.5 A, 2 A, 2.5 A, or 3 A. Due to the novel low loss top electrodes the increased coverage will not to detrimental to the light extraction efficiency of the LED. An example plan view of the top electrode is shown in the insert in FIG. 2a. Two square pads at the bottom edge of the LED device exist for wire bonding. Cross-connected electrodes across the top surface allows for improved even current spreading across the surface of the n-doped material 104. The spacing of the electrodes, as well as their width, directly relates to the efficiency of injecting the carriers at high current into the LED device.

The high reflectivity metallic layer 203 that is also employed for improved electrical conductivity and adhesion can comprise of the same materials and is designed in the same way as layer 101. However, it is important to note that the order of the deposition of the metals is reversed due to layer 203 residing on the top surface rather than underneath the LED device.

In another example of the invention a thin layer is disposed between the top CMR stack and the top semiconductor material. This is to aid adhesion properties and also improve electrical conductivity. The composition of this layer can be selected from a similar group of materials as the top thin layer.

In a preferred embodiment of the present invention, the separation distance between the light emitting region, 103, and the top and bottom CVMR stack, 206 and 110 respectively, is optimised in order to achieve an optical cavity effect and maximise light extraction out of the top emitting surface of the light emitting device. Photons emitted directly from the light emission region of the LED are allowed to interfere constructively with photons reflected by the CVMR stack. The complex phase relationship of the CVMR stack is utilised in conjunction with the separation distance to optimise the resulting interference pattern inside the light emitting device in order to improve the light extraction efficiency.

In order to determine the interference pattern residing in the light emitting region the following expression is solved:

$$|E|^2 = a_\rho^2 + a_r^2 + 2a_\rho a_r \cos(\pi + \phi_{CVMR} + \phi') \quad (15)$$

Where E is the Electromagnetic field profile residing in the light emitting device, $a_\rho$ is the amplitude of the emitting light, $a_r$ is the amplitude of the reflected light and $\phi_{CVMR}$ is the phase shift due to reflections from the CVMR stack and $\phi'$ is the phase shift due to the optical path length difference. The phase shift $\phi_{CVMR}$ is determined by a method such as the above mentioned transfer matrix method or similar technique. Subsequently $\phi'$ can be determined by the following expression $$\phi' = \frac{4\pi d \cos\theta}{\lambda_{LED}} \quad (16)$$

Where d is the separation distance between the light emitting region, 102 and the CVMR surface, either 110 or 206. The angle of the photon from the normal to the CVMR surface is defined by θ while the effective wavelength in the light emitting device is defined by $\lambda_{LED}$.

Figure 2B:
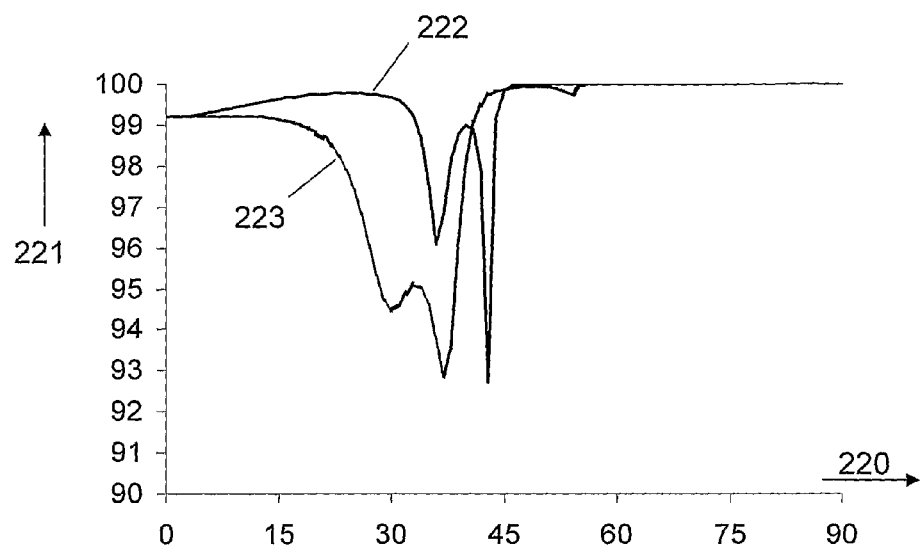
FIGS. 2b and 2c show, as a function of angle of incidence, the reflectivity amplitude and phase, respectively, experienced by photons in the light emitting region when optimizing the optical cavity effect.
Figure 2C:
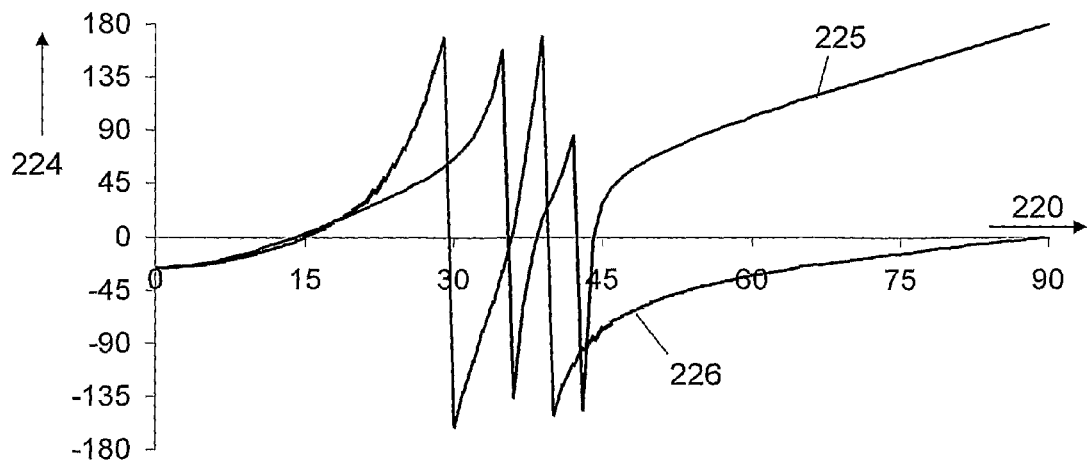

It is noted that for a light emitting device of the prior art with an Ag bottom reflector utilising the optical cavity effect requires the separation distance to be controlled to within ~4% to achieve a light output tolerance of approximately 3%. In the case of a typical CVMR stack utilising a LED-SiO$_2$ (81.5 nm)-Ta$_2$O$_5$ (48.0 nm)-SiO$_2$ (108.8 nm)-Ta$_2$O$_5$ (56.9 nm)-SiO$_2$ (54.7 nm)-Ag (100 nm)-Al (100 nm) the separation tolerance is much improved whereby a variation of ~4% in the separation only provides a variation of ~0.4% in the light output. FIGS. 2b and 2c, respectively, highlight the reflectivity in terms of amplitude, 221, and phase, 224, of photons residing inside a light emitting device of GaN semiconductor material as a function of incident angle 220. Both TE, 223 and 220, and TM, 222 and 225, polarisations are indicated on both amplitude and phase plots. The complex and discontinuous phase shifts experienced by photons reflecting off the CVMR stack are clearly indicated in 225 and 220. The phase and amplitude data is utilised in equation (15) and (16) to determine the total light extraction in a light emitting device employing the optical cavity effect.

Figure 3A:
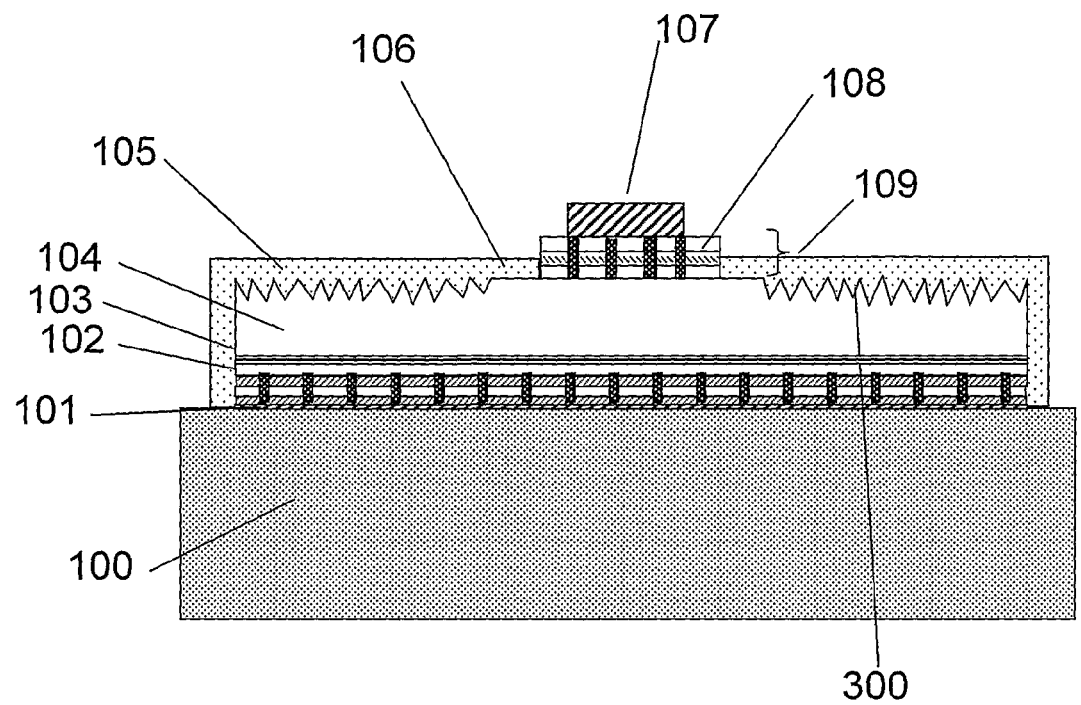
FIGS. 3a and 3b show a cross section of an example of a light emitting diode of the present invention with top surface roughening.

In one example of the invention the top n-doped GaN material 104 is roughened to allow for increased probability of light escaping out of the top surface of the LED. This is shown in FIG. 3a. The roughening process, 300, introduces many scattering centres at the surface of the LED to allow light an increased chance of escape out of the top surface. The scattering centres increase the probability of photons incident on the roughened surface to lie inside the GaN-air escape cone angle. The roughness can take shape in many different forms, such as wet-etched pyramidal or inverted pyramidal structures on the surface of the GaN material, as deposited clusters of high refractive index optically transparent dielectrics, or additionally as perturbed re-growth of a high refractive index materials. If small scale roughness, of the order of the emitted wavelength, is introduced ($\sim\lambda/n_{GaN}$), trapped modes incident on the surface experience diffuse reflectivity as opposed to specular reflectivity, thus increasing their chance of residing within the escape cone at the next multiple internal reflection. In a preferred aspect of the current invention the top emission surface is randomly arranged with protruding pyramids ranging in size between approximately 0.5 μm and 2.5 μm, providing high extraction efficiencies for trapped waveguide modes. Top surface extraction enhancement factors of up to 2.5, 3.0, 3.5, 4.0, 5.0, or 6.0 are experienced, as compared to a bare un-roughened un-encapsulated LED with approximately 4.35% of the light emitted out of the top surface.

Figure 3B:
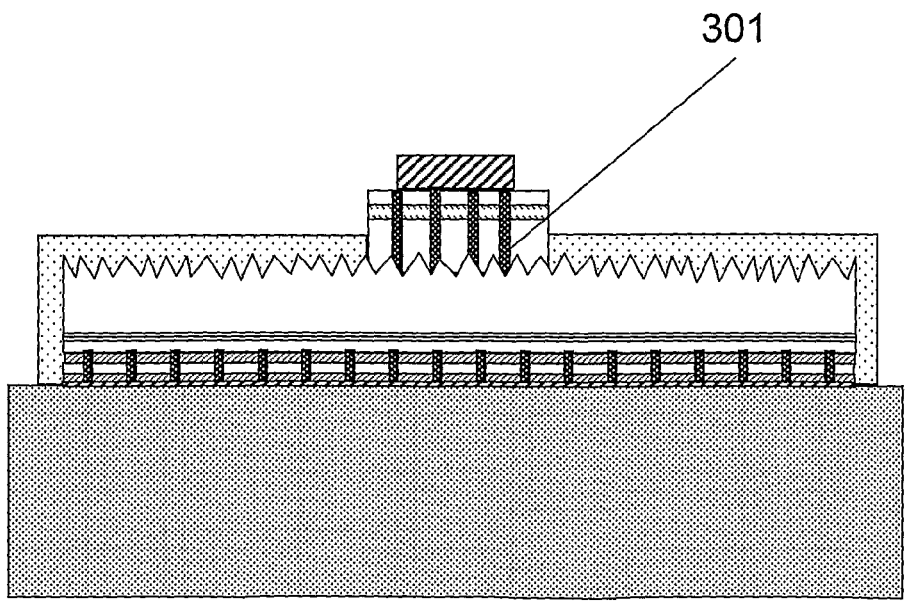

In FIG. 3b, another embodiment of a roughened top n-doped GaN surface is demonstrated. In this case, the n-GaN top surface region under the top CVMR contacts, 301, are also roughened. This allows light that was specularly reflected by the top contact region to diffusely reflect down and allow an increased probability of the light to reside in the escape cone at the next incidence on the top roughened surface.

Figure 4A:
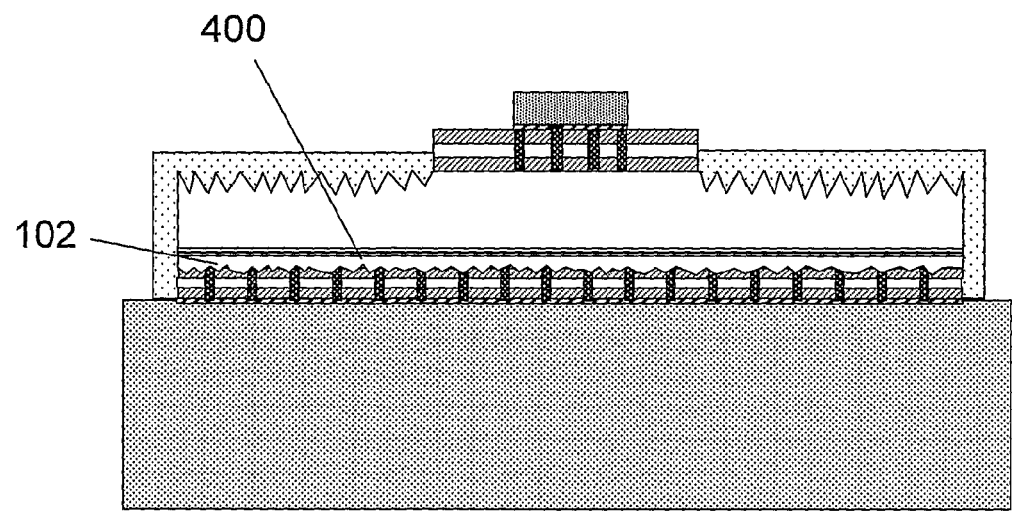
FIGS. 4a and 4b show a cross section of a light emitting device of the second type with top and bottom surface roughening.
Figure 4B:
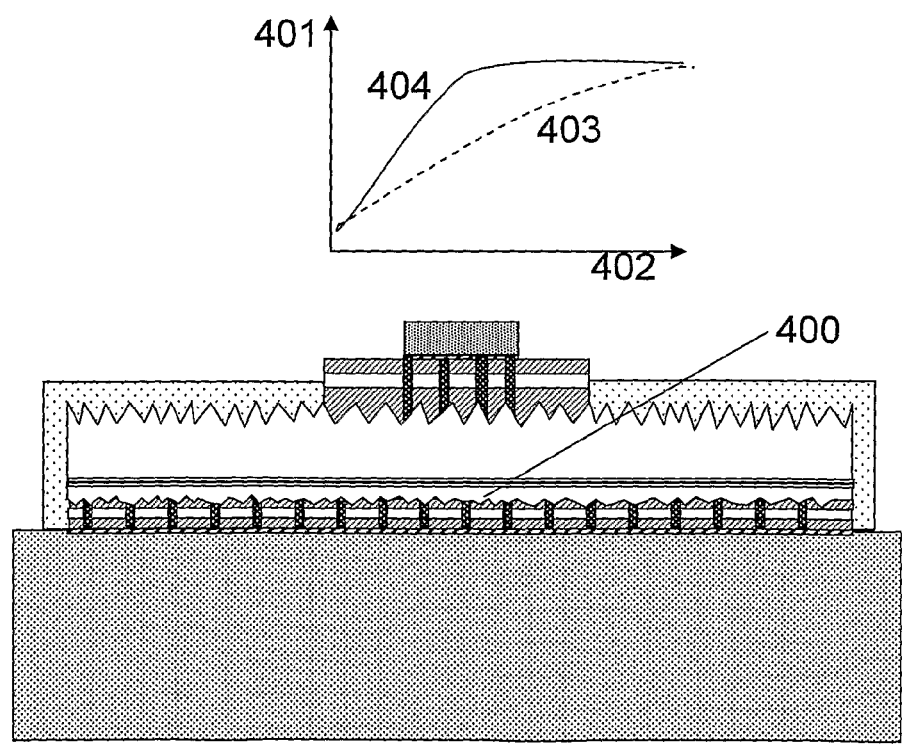

In FIGS. 4a and 4b, another exemplary illustration of roughness is employed on another embodiment of the present invention. In this case bottom surface roughening 400 is also applied to layer 102 of the LED device. In another example, the surface roughness is also applied to the top surface of the n-GaN region under the top CVMR stack, as indicated by FIG. 4b. In the current example, the double diffuse structure allows for an even greater probability of trapped light escaping out of the top surface of the structure in the shortest propagation distance possible. If the rate of light extraction (401) against propagation distance (402) for a trapped photon is plotted then light escapes out of the structure at a faster rate when a doubly diffuse LED device is employed (404) than when a singly roughened surface is employed (403).

It is also beneficial that an optically diffuse or roughened surface between the light emitting region and the CVMR stack is introduced in order to eliminate coherent interference between directly emitted and reflected photons. The elimination of coherence allows the removal of any sensitivity on the separation distance tolerance between 103 and either the top or bottom CVMR. Another advantage of the use of diffuse layers is the ability to completely remove the sensitivity of the CVMR reflectivity to the phase properties, only the absolute magnitude of reflectivity of the CVMR stack can be solely utilised in the selection rather than the magnitude and phase of the reflectivity of the CVMR stack.

In the present example, a light emitting device employing the previously mentioned SiO$_2$—Ta$_2$O$_5$ CVMR stack is used for illustrative purposes. The optical cavity effect is employed and the separation distance between the light emission region and the surface of the CVMR stack is optimised at 235 nm. This optimal separation is determined using equation (15) and (16). The light emitting device achieved a light extraction figure of ~70.8% when the light emitting device is encapsulated in a medium of refractive index of n=1.5. It is noticed that the optical cavity structure gives rise to a sharp drop in the light extraction due to the complex nature of the reflection phase shift, 225 and 226, as indicated in FIG. 2c, at the CVMR stack interface that inhibits simultaneous optimal cavity tuning for all incidence angles 220 and both polarisations. However, if a diffuse rough surface is introduced the light extraction of the same CVMR stack rises to ~96.5%.

This allows greater flexibility on the material system employed in the CVMR stack whereby only the absolute magnitude of reflectivity of the CVMR stack can be solely utilised in the selection rather than the magnitude and phase of the reflectivity of the CVMR stack.

Figure 5B:
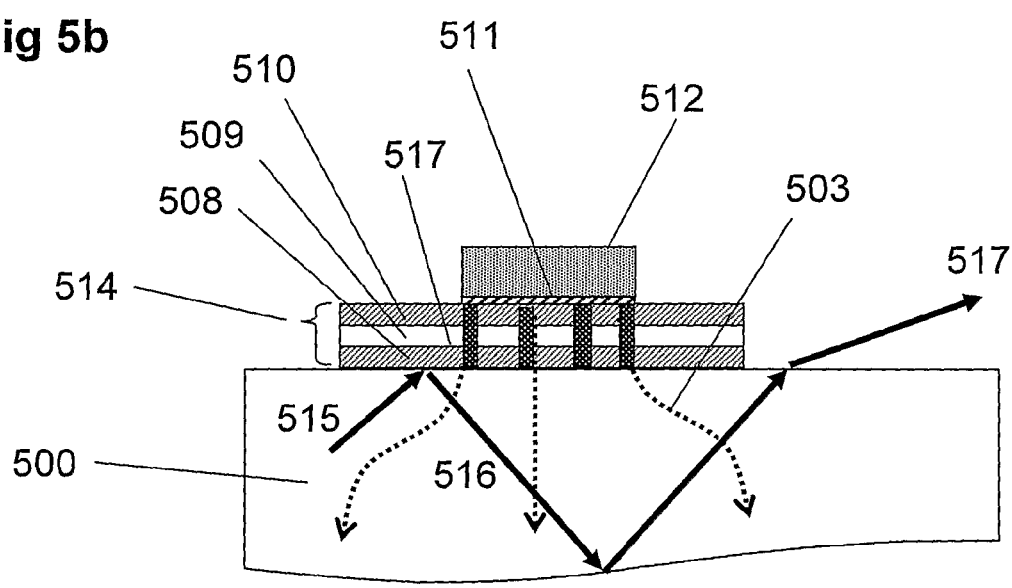
FIG. 5b illustrates of the minimal loss experienced by trapped photons incident on a metal contact of the present invention.
Figure 5C:
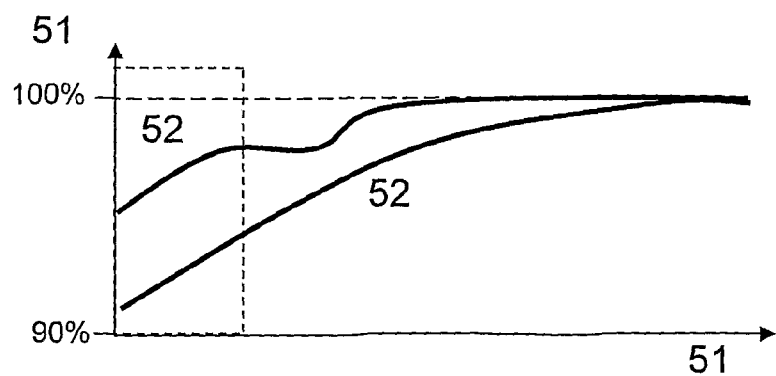
FIG. 5c shows a graph of reflectivity versus light incident angle for an ODR known in the art and for a CVMR stack of the present invention.

In FIG. 5, the benefits of the present invention are compared with prior art designs for top metal contacts. In FIG. 5a prior art top metal contacts are demonstrated. The metal contact, 502, adheres to the top of the n-GaN material of the LED structure, 500, by use of an adhesion layer 501. Electrical injection, 503, and carrier diffusion into the n-type material is achieved by the direct metal contact. However, trapped photons 504 incident on the metal contact 502 experience a large amount of optical loss, 507, is experienced and specular reflection 505 is greatly attenuated. By contrast, FIG. 5b shows an example of the operation of the present invention. The top transparent CVMR stack 514 resides between the metal contact 512 and the LED n-type GaN material 500. A metal adhesion layer 511 between the 514 and 512 allows for improved adhesion between the metal contact and the 514 CVMR stack. In this case, trapped photons 515 incident on the transparent CVMR stack reside in the electromagnetic bandgap of the reflector and are forbidden to propagate through the stack 517 and onto the metal contact 512. Additionally, the diameter and spacing of the metal vias are designed to inhibit coupling into any Plasmon resonances associated with the metal. The evanescent field setup inside the CVMR stack, 514, due to the optically transparent reflector, allows a very low loss optical reflection 516 back into the GaN material. As the area of the metal vias is small compared to that of the multilayer stack, there is a significant improvement in the optical loss associated with the metal contact in 5a.

In the examples here, the TMM is used to determine the normal incidence reflectance of photons in the blue wavelength range for some typical examples as demonstrated in FIG. 5a and FIG. 5b. Table 2 shows the characteristic normal incidence power reflectances for different metal electrodes in the blue wavelength range for prior art contacts. From the current selection of metals, the highest reflecting metals are Ag and Al, whereby approximately 11.3% and 16.7%, respectively, of loss is introduced at every reflectance, as shown in 505.

It is typical for light to undergo several reflections in the LED device prior to extraction and hence the overall loss experienced by the photons is multiple orders larger than the quoted figure. It is noted that in a typical commercial vertical LED device the optical reflectivity of the mirror is approximately 80%.

TABLE 2

| Metal | Reflectance (%) |
|---|---|
| Au | 18.7 |
| Ag | 88.7 |
| Ni | 16.7 |
| Cr | 30.6 |
| Al | 83.3 |

Using the conductive CVMR stack shown in FIG. 5b, an example utilising Magnesium Fluoride of refractive index n=1.3 and ITO of refractive index n=2.1 will be demonstrated. The multilayer stack composition is highlighted in table 3. The layers are listed with the first being deposited closest to the underlying semiconductor layer 500. Layer numbers 1 to 4 listed in Table 3 lie in the CVMR stack 514, while layer number 5 is the metal electrode layer 512 in FIG. 5b. The total CVMR thickness amounts to approximately 270 nm with a reflectance of 98.5%.

TABLE 3

| Layer number | Material | Refractive index | Thickness (nm) |
|---|---|---|---|
| 1 | Magnesium Fluoride | 1.3 | 85 |
| 2 | ITO | 2.1 | 55 |
| 3 | Magnesium Fluoride | 1.3 | 85 |
| 4 | ITO | 2.1 | 55 |
| 5 | electrode - Ag | 0.15 + j2.5 | >50 nm |

The presence of the imaginary unit j in the refractive index for the Ag electrode, indicates a complex refractive. The improvement in the efficiency of the different electrode designs of the present invention and that of the prior art can be clearly visible when light trapped in the LED device experiences multiple passes in the vicinity of the electrodes. Table 4 shows a comparison of power remaining in a photon experiencing multiple reflection in an LED of the present invention and an LED of the prior art. The percentage improvement of the present invention over the prior art is listed in the final column.

TABLE 4

| No. of reflections | Power remaining in LED of present invention | Power remaining in LED of prior art (Ag metal) | Improvement |
|---|---|---|---|
| 1 | 0.985 | 0.887 | 11.0% |
| 2 | 0.970 | 0.787 | 23.3% |
| 4 | 0.941 | 0.619 | 52.0% |

In the case of one preferred example of a CVMR stack, 7 layers are employed in the multilayer stack of the CVMR, giving the structure shown in Table 5.

TABLE 5

| Layer number | Material | Refractive index | Thickness (nm) |
|---|---|---|---|
| 1 | Magnesium Fluoride | 1.3 | 249 |
| 2 | SiO$_2$ | 1.46 | 89 |
| 3 | Magnesium Fluoride | 1.3 | 87 |
| 4 | SiO$_2$ | 1.46 | 69 |
| 5 | Magnesium Fluoride | 1.3 | 120 |
| 6 | SiO$_2$ | 1.46 | 82 |
| 7 | Magnesium Fluoride | 1.3 | 75 |
| 8 | Reflector - Ag | 0.15 + j2.5 | 20-80 |
| 9 | Reflector - Al | 0.53 + j5.1 | 50-300 |
| 10 | electrode - Cu | 0.15 + j2.5 | >100 nm |

This stack was analysed and reflectivity across all incident wave vectors was above 94%. The metal reflector employs a multilayer of Ag and Al, which improves performance at shorter wavelengths between 200 nm and 450 nm. The improvement of the overall reflectivity is plotted in FIG. 5c. An Omnidirectional Reflector (ODR) with an Ag reflector, 520, as described in the prior art with 180 nm ITO layer, is compared with the CVMR of the present invention, 521. The x-axis represents incident angle, 518, while the y-axis indicates the percentage reflectivity, 519. It is clear that the CVMR stack is dramatically more efficient especially for off normal incidence light, where greater than ~50° incidence is 100% reflected. It is also important to note that the CVMR stack is designed to be least efficient where light extraction is most efficient, as this allows light that experiences more loss at each reflection pass to be extracted more quickly. Typically, for a smooth un-roughened LED device, the light extraction is most efficient where the incident angle of the trapped photons is within the light escape cone (indicated by the dashed box in FIG. 5c). During the CVMR design, drop in reflectivity for the stack is optimised to reside within the escape cone of the LED device.

Additionally, as shown in FIG. 5a and FIG. 5b, in both cases the finite size of the contact inhibits light emitted under the contact to escape. In the case of the present invention (as shown in FIG. 5b) this trapped light is not attenuated by the contact and is allowed to escape after subsequent multiple total internal reflections, eventually escaping out of the LED surface as indicated in 517. This allows for an increase in the total luminous output of the LED.

Figure 6:
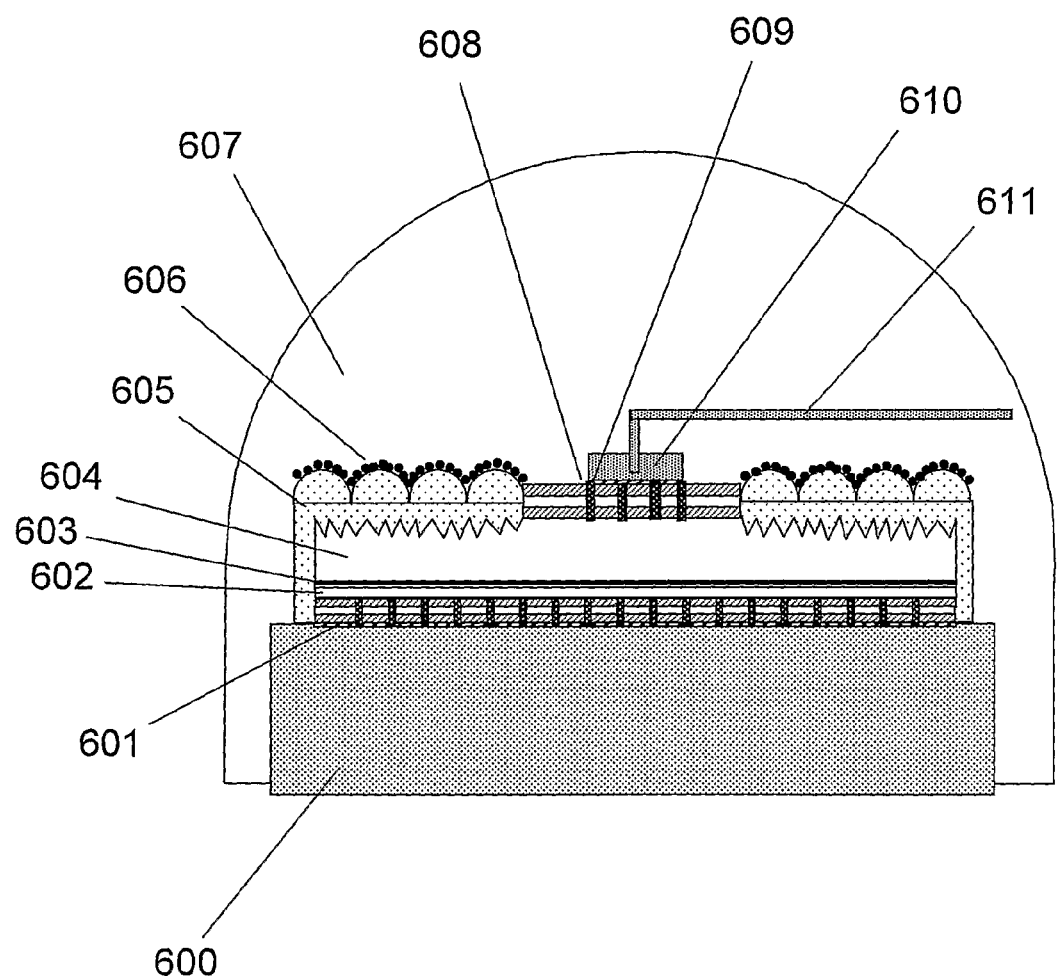
FIG. 6 shows a cross section of a light emitting module of the present invention for use in solid state lighting applications.

In another aspect of the present invention, a light emitting module is formed by embedding a phosphor in an encapsulating material that resides on top of the light emitting device of the present invention. This is shown in FIG. 6, where the phosphor is denoted by 606. The encapsulation comprises of two layers of optically-transparent environmentally-resistant material. The first encapsulation material that is disposed proximal to the light emitting device, 605, is formed of a high refractive index material, and can be textured or shaped to extract the maximum number of photons. Other forms may be possible. The encapsulant 605 can comprise, but is not limited to, a silicone material with a refractive index of approximately 2.1, 2.0, 1.8, or 1.6. A high refractive index encapsulant allows a larger amount of light to escape from the roughened surface of the LED due to the larger escape cone angle. The texturing can also allow the far-field radiation profiles of the LED to be altered. This may be in the form of a Fresnel lens or micro-lens texturing.

The phosphor is subsequently disposed on the high refractive index encapsulant 605 while another encapsulation material 607, distal to the light emitting device, is disposed on the top of the phosphor. The phosphor 606 itself is located proximal, but not in contact with, the top n-GaN LED material 604 to avoid thermal heating of the phosphor and to improve its lifetime. The phosphors may comprise of, but are not limited to, YAG:Ce, phosphors based on II-VI materials such as selenides, tellurides and sulphides and ZnS and InP, as well as Europium-doped Silicate phosphors, Cerium and Terbium doped oxides and nitrides. In these cases, the combined emission from the phosphor and the LED are designed to emit the desired colour.

The distal encapsulant 607 can also be shaped to provide the desired far field emission out of the light emitting module. The shaping can vary from horizontally flat to hemispherical, for Lambertian emission, to parabolic for directional emission, or to other more complex shapes for many different desired far-field emission profiles. The encapsulant 607 also acts as a passivation layer to protect and seal the LED from environmental factors. Additionally, the encapsulant 605 and 607 can comprise the same material. Another passivation layer may also reside between the first encapsulation layer 605 and the LED device as will be described in the method of manufacture. The encapsulants can comprise, but are not limited to, silicone gels and resins and elastomers, ABS resins, epoxy, acrylates, spin-on glass, PMMA, and thermoplastics and thermosetting resins.

An adhesion layer and reflector layer, 606, such as Ni/Au, or Ag is deposited on top of layer 609. A metal contact 610 is placed subsequently on layer 608. This acts as an electrode to spread current across the surface on the LED, as well as a region with an adhesion surface for wire bonding. Electrical contact is made by wire 611 contacting the top electrode, while the circuit is closed by making another contact with the conductive carrier 600.

The light emitting module may be used for applications where white illumination is required, such as in solid-state lighting as well as, but not limited to, other applications, including architectural, medical or signage applications.

In another implementation of the present invention the bottom and top CVMR stack layers allows the light emitting device to be thinned down to a total thickness less than 5 µm, 3.5 µm, 3.0 µm, 2.5 µm, 2.0 µm, or 1.0 µm. This allows the LED to achieve high extraction efficiency while still maintaining high current injection. If the example of the LED structure of FIG. 1 is revisited, the LED waveguide structure 104, 103 and 102 are reduced in thickness allowing fewer confined modes to reside in the waveguide and hence more efficient light extraction. Typically a 3 micron structure will possess approximately 44 trapped modes, while a thinner 1 micron LED structure can sustain approximately 15 trapped modes. Fewer modes allow surface extraction techniques such as roughening to perturb a large percentage of the trapped mode residing in the waveguide and hence will enable efficient coupling of the trapped mode into leaky modes and subsequent extraction in a short propagation distance.

One drawback of reducing the thickness of the LED device is a corresponding reduction in the ability for the n-doped material 104, for example n-GaN, to spread carriers horizontally, ultimately causing current crowding in the layer 104 and thereby affecting the injection efficiency of the LED. In the present invention, by employing low-loss conductive CVMR stacks, increased percentage coverage by the top electrodes is achieved to minimise current crowding and allow improved current injection and high drive current in thin LED devices. Top electrodes can be introduced at intervals of a minimum of 100 µm, 80 µm, 60 µm, 40 µm, and 20 µm.

Method of Manufacture

In the final aspect of the present invention a method of manufacture of a vertical LED structure with a metallic substrate and reduced loss metal contact regions is proposed. The metal substrate provides both good thermal and electrical conduction during LED operation. Other benefits of vertical LED structures arise from the existence of one top metal contact rather than two which effectively increases the active top emission area. The large area bottom metal contact also improves the electro-static discharge capabilities of the device.

Figure 7A:
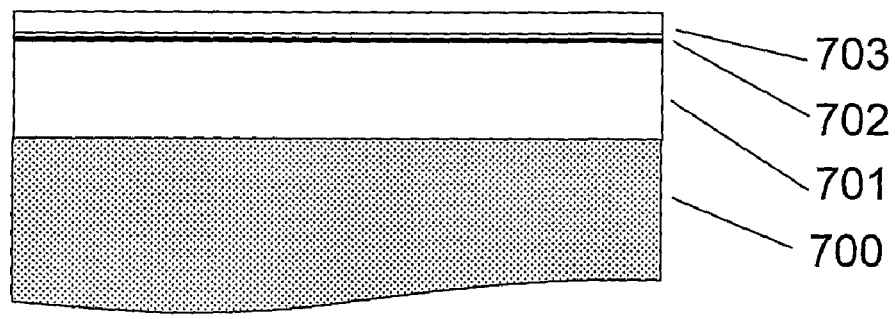
FIGS. 7a to 7g illustrate the processing steps performed in the fabrication of a light emitting diode of the present invention.

An example GaN based LED epitaxially grown on a suitable growth wafer 700 is shown in FIG. 7a. The growth wafer can comprise, but is not limited to, Sapphire, Silicon Carbide, free-standing GaN or any other lattice-matched material. The growth wafer can also comprise of non-lattice matched materials such as Si, this is particularly beneficial when moving to larger six inch (152.4 mm) wafer diameters. This growth can be achieved by use of stress-relief layers such as nanocolumnar GaN, AlN or ZnO or other techniques.

The LED device comprises of at least n-type semiconductor layer 701, followed by an active light emitting region 702, subsequently followed by a top p-doped semiconductor material 703. The active region 702 can comprise a single quantum well (QW) region or multiple quantum wells (MQW). These layers are grown by conventional semiconductor growth techniques such as metal organic vapour phase epitaxy (MOCVD) or molecular beam epitaxy (MBE), or alternatively atomic layer deposition (ALD) or other similar technique.

In the case of n-GaN layer 701, the layer can have a thickness of about 0.5 µm, 1.5 µm, 2.0 µm, 2.5 µm, 3 µm and 4 µm. The MQW region 702 can comprise InGaN/GaN or AlGaN/GaN multilayer stacks. When these layers are forward biased they can emit light in the region between 240 nm and 680 nm. In the case of the p-doped GaN layer, the thickness can vary between 5 nm and 400 nm, and is preferably about 50 nm, 100 nm, 150 nm, or 180 nm. It is important to note that the structure will be inverted and hence the current top surface will reside at the bottom of the device once the processing steps are complete.

Figure 7B:
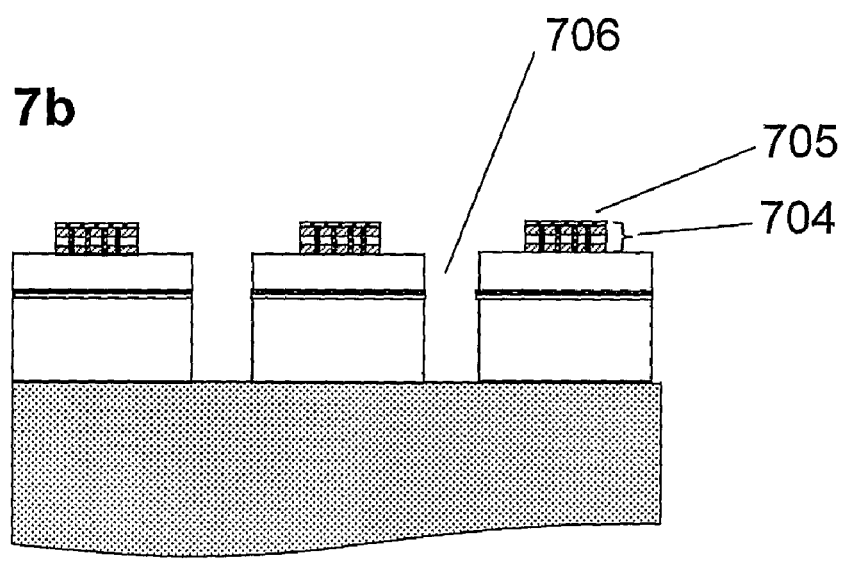

As shown in FIG. 7b, the bottom transparent CVMR stack is deposited. This can be carried out by any conventional deposition technique such as, but not limited to, any chemical vapour deposition technique (CVD), such as low-pressure chemical vapour deposition (LPCVD), plasma-enhanced chemical vapour deposition (PECVD), atomic layer deposition (ALD), or other techniques such as sputtering or evaporation. In a preferred deposition process, low temperature deposition, evaporation or sputtering techniques are employed. These may include but not limited to e-beam evaporation, plasma assisted, plasma enhanced, Ion Beam assisted, electron beam assisted, Remote Plasma assisted, reactive magnetron sputtering, open and closed field magnetron sputtering. The vias are then defined via a lithography process and etched via a dry or wet etch down to contact the underlying semiconductor. A first metallic low resistivity contact layer 705 is subsequently deposited on the structure. This layer also acts as a good adhesion layer between the metal permanent substrate and the underlying p-doped GaN or semiconductor region. This contact region is preferably formed from Ni/Au, Ti/Au, Cr/Au, Au, Pd, Pt, Ru, Ni, Cr, ZnO, CNT, Ag, ITO, Al, or W, although other materials are possible. As an outcome of the present invention, a larger selection of conductive adhesion metal layers can be employed, as the reflector 704 resides between the layer 705 and the p-GaN region 703, and hence optically lossy metallic layers can also be utilised.

The lithographically defined via diameter may range between 150 nm to 5 µm, 10 µm, 25 µm, 50 µm, 100 µm, or 200 µm. However, in another aspect of the invention, non-photolithographically defined conductive vias residing in the CVMR can also be employed.

In the first example, the locations of the vias can also be defined using a nano-imprinting technique utilised to transfer the via pattern onto a resist or hard mask material subsequently employed to transfer the pattern into the multilayer stack.

In the second example, an anodised metal oxide such as anodised aluminium oxide (AAO) is utilised as an etching template for the conductive vias. Such techniques are described in European Patent Specification No. EP0178831 and in U.S. Application No. 2003/0010971A1. Using this technique the spacing that can be achieved between neighbouring vias can range between about 25 nm and about 500 nm, while the via diameter ranges between about 8 nm to about 150 nm. It is also important to note that during the step of etching into the CVMR multilayer the vias can be expanded out further to satisfy the desired dimensions.

In the third example, a template of self-assembled inorganic-containing block copolymers such as polystyrene-b-polyferrocenylsilane (PS-b-PFEMS) is deposited on the top surface to act as a hard mask for the pattern transfer of the via locations. During self assembly the copolymer arranges into arrays of hexagonally close-packed cylindrical PFEMS microdomains in a PS matrix. The PFEMS domains can be removed to leave the matrix as a hard mask. The size and spacing of the nanostructured hard mask can be adjusted by tailoring the polymer chain length.

In the fourth example, a colloidal templating technique is utilised. Insulating colloids such as Silicon Dioxide or Silicon Nitride are arranged in a close packed hexagonal pattern on the surface of the LED device. A multilayer of metals is electrodeposited through the colloids to form a macroporous network of metal. These metals are annealed in oxygen or chemically oxidised to form transparent conductive metal oxides. Subsequently, further metal is deposited, such as Ag, onto the colloids to form a metallic conductive via comprising of frusto-spherical porous colloidal network.

The vias are defined lithographically and etched into the multilayer stack to form the CVMR. The bottom contact region is defined by use of a mask and transferred into the transparent CVMR stack and the metal layer is deposited to form the vias, as shown in 704 and 705. The metal is grown by evaporation, sputtering, electroplating or electro-less plating. The via patterns are transferred using the hard mask and etched using techniques suitable for materials residing in the transparent CVMR stack and the metal 705 such as, but not limited to, wet etching or plasma etching including reactive ion etching (RIE) and inductively coupled plasma (ICP).

Following the definition of the bottom CVMR stack the LED die regions are defined lithographically and etched to form trenches 706, isolating the individual LED die. The formation of the individual LED die prior to flip chip and growth wafer removal allows improved stress relief.

Figure 7C:
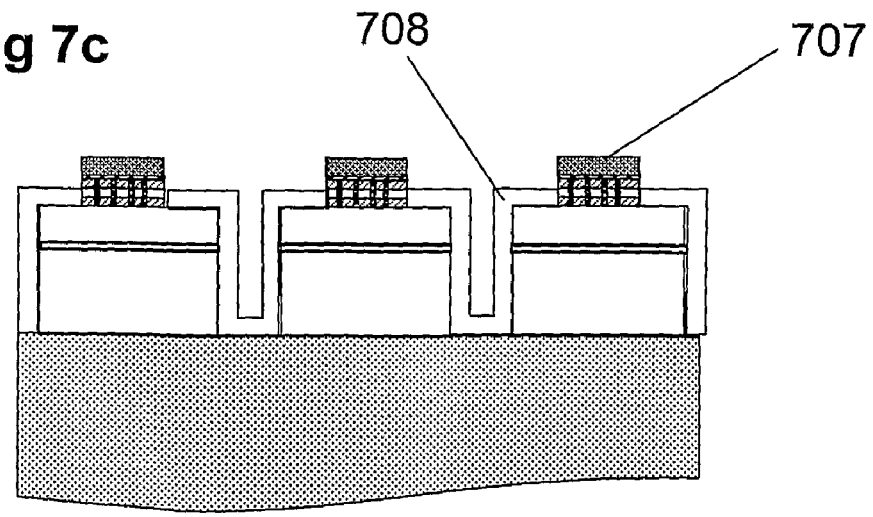

A passivation layer 708 is allowed to fill and overcoat the trenches 706, as shown in FIG. 7c. The passivation layer can comprise, but is not limited to, $SiO_2$, $Si_3N_4$, polymer or spin-on-glass. Subsequently, a metal seed layer 707 is grown on top of the adhesion layer 705. The passivation layer acts to protect the GaN from environmental factors as well as avoid the conductive seed layer shorting the LED structure. Layer 707 provides the seeding for any subsequent chemical plating process. This layer can comprise metals such as Cr, Cu, Pt, Au, Ag, Ti, Ni, and Pd.

Figure 7D:
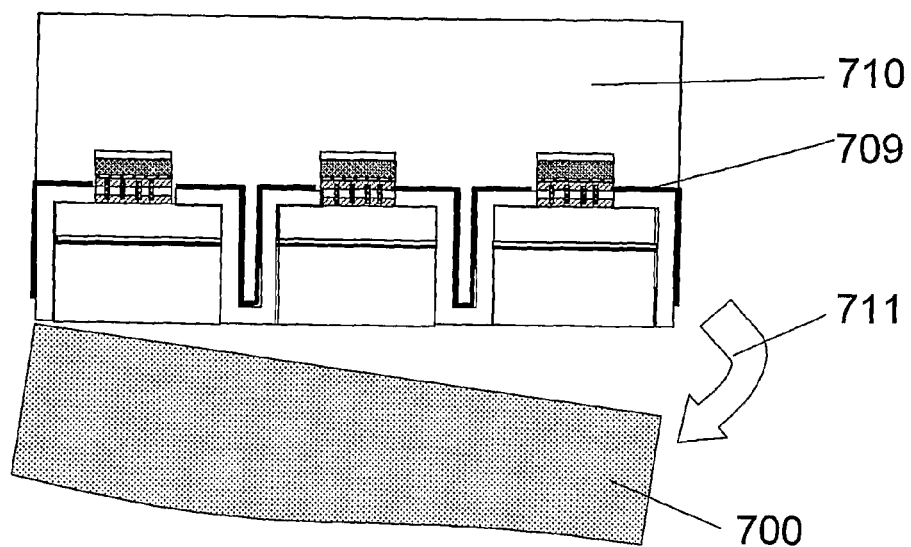

As shown in FIG. 7d, an additional metal adhesion layer 709 may optionally be deposited on the top surface of the passivation layer 708. The material can be selected from the same metals suitable for layer 705. Following deposition of the optional layer 709, the carrier metal substrate layer 710 is overgrown. This can comprise, but is not restricted to, any one of, or a mixture of, Au, Cu, Ni, Cr, Pt, Pd, In, W, and Al. The metal is grown by evaporation, sputtering, electroplating or electro-less plating. A thick layer of metal is formed with a thickness of approximately 20 µm, 50 µm, 100 µm or 150 µm. This thick layer 710 provides a rigid support to hold the underlying LED die during removal of the growth substrate 700. The removal process can be achieved by a selective etching process, lift-off process such as laser lift-off, or polishing method. A combination of such devices can also be implemented. Following removal of the growth substrate 700, the LED dies are flipped, as shown in FIG. 7e.

The carrier substrate 100 or 710 can also comprise of multilayers of materials. These may include materials with high thermal conductivity such as but not limited to Aluminium Oxide or Aluminum Nitride. Such materials can be deposited using, but not limited to, evaporation and sputtering. In a preferred deposition process for such materials techniques employed for the deposition of the CVMR stacks are also utilised. Additional materials in the carrier substrate can also be attached to the underlying LED die using wafer bonding techniques. In a preferred method of wafer bonding a low temperature bonding process is employed. The high thermal conductivity layers allows the light emitting device to operature at much higher drive current while still maintaining efficient heat dissipation and low junction temperatures.

Figure 7E:
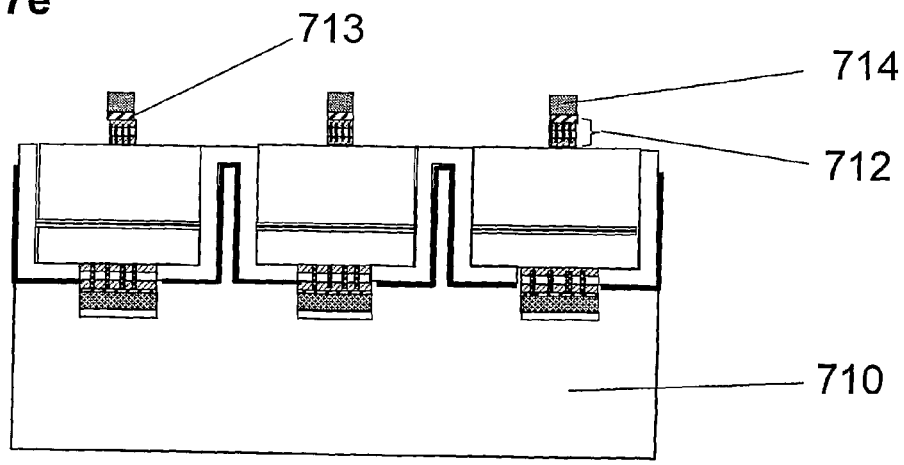
Figure 7F:
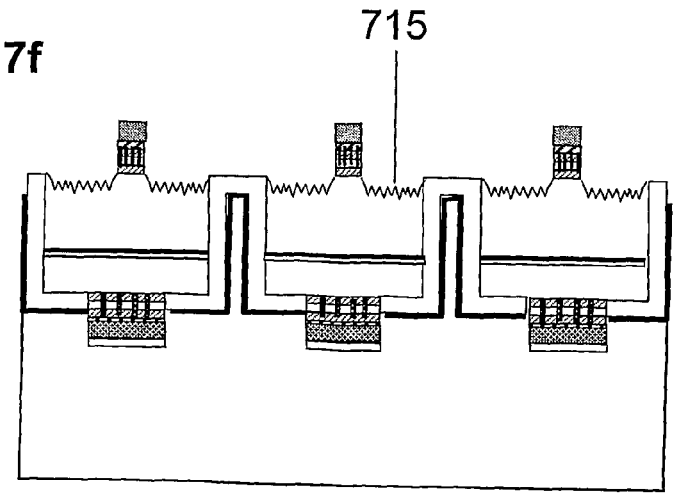

As shown in FIG. 7e, the new permanent carrier is now the thick metal layer 710, and the n-doped GaN or semiconductor material is the top exposed surface. The top CVMR stack is then deposited. The different layers in the multilayer stack are successively deposited using processes similar to those utilised for the bottom transparent CVMR reflector. Subsequently, an adhesion layer is also deposited to assist with the bonding of the final top metal contact. An additional lithography and etch step is required at this stage to define the shape of the top transparent CMR stack. These steps will comprise similar processing steps to those used for the CVMR stack 704.

If, during the deposition of the transparent CVMR reflector, one or more dielectric materials are introduced, then an overcoating conductive, optically-transparent layer is deposited to allow electrical conduction between the top metal contact 714 and the N-doped GaN layer 701, as shown in FIG. 7. The selection criteria for suitable materials and deposition techniques for the overcoating layer are identical to those of the top and bottom CVMR layers. Following deposition another lithography mask pattern transfer and etch step is included to redefine the location of the overcoated top contact region and remove any conductive layer extending further than 1 μm, 2 μm, 3 μm, 5 μm, or 10 μm around the perimeter of the transparent CVMR reflector 712.

Finally, an n type metal electrode contact pad 714 is patterned on top of the CVMR stack 712 using a lift-off process. A lithography step and negative resist are employed to deposit the metal conformally on the top surface of the CVMR stack. A wet or dry plasma etch are used to transfer the pattern into the resist.

In order to improve the light extraction capabilities of the LED device from the top surface, the n-GaN material is roughened. This can be accomplished by many techniques, such as wet anisotropic etching or photo-assisted wet etching. In this case pyramids, inverted pyramids, or a whisker type roughness following the crystal plane of the GaN are formed by use of chemicals such as, but not limited to, KOH. During wet etching the concentration, temperature, UV irradiation and biasing of the samples can all be controlled to assist in roughening the surface. The pyramid diameter is preferably between 0.5 μm and 2.5 μm.

Alternatively, high refractive index (preferably larger than n=2.0) optically transparent clusters of size approximately 0.5 μm, 1.0 μm, 1.5 μm, or 2.0 μm can also be utilised instead of the wet etching process. Nano-clusters of materials, such as $Si_3N_4$ or GaN crystals, can be deposited on the surface of the n-GaN to improve light extraction.

Figure 7G:
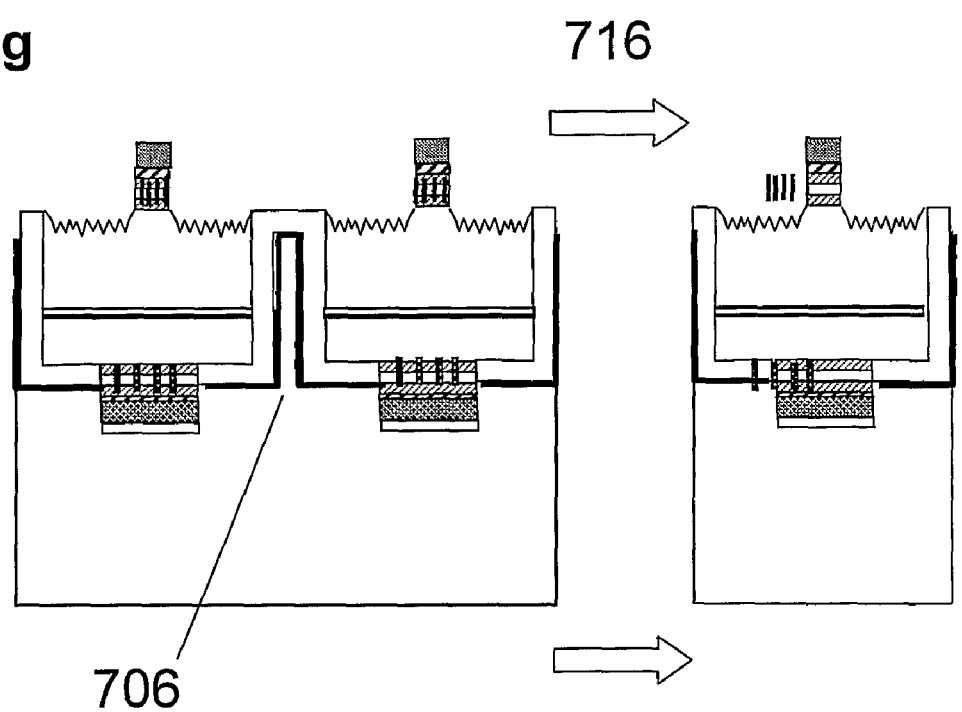

Finally, as shown in FIG. 7g, the individual LED die are separated along the trenches 706. The devices can subsequently be packaged with encapsulant and phosphors, as shown in FIG. 6, to provide solid state lighting modules suitable for use in a variety of applications.

The invention claimed is:

1. A light emitting device comprising:
a first semiconductor layer having doping of a first type;
a second semiconductor layer having doping of a second type;
a light emitting region interposed between the first and second semiconductor layers, wherein light generated in the light emitting region is extracted from the device through a surface of the second semiconductor layer;
a first multilayer reflector stack disposed proximal to the first semiconductor layer and distal to the second semiconductor layer, the first multilayer reflector stack at least partially covering the first semiconductor layer, wherein, in use, at least 60% of light that is generated in the light emitting region and that is incident on the first multilayer reflector stack is reflected by the first multilayer reflector stack;
a first electrode disposed on the first multilayer reflector stack and at least partially covering the first multilayer reflector stack; and,
a first network of electrically conductive elements disposed in the first multilayer reflector stack,
wherein:
the first reflector stack comprises at least three layers, including two layers of different materials having different refractive indexes, and a layer of a metal, the two layers disposed distal to the first electrode and the layer of metal disposed proximal to the first electrode, the conductive elements of the first network extending through said two layers to the layer of metal whereby to provide an electrically conductive path between the first semiconductor layer and the first electrode,
at least one of the first semiconductor layer, the second semiconductor layer and the light emitting region has a refractive index with a magnitude greater than that of the lowest refractive index of material residing in the first multilayer reflector stack by a factor of at least 1.25; and,
location, shape and transverse dimensions of the electrically conductive elements in the first network are predetermined such that, in use, light generated in the light emitting region that is incident on the first network of conductive elements is reflected and is forbidden to couple into localized or propagating surface plasmon modes associated with the first network of electrically conductive elements.

2. A light emitting device according to claim 1, further comprising:
a second multilayer reflector stack disposed proximal to the second semiconductor layer and distal to the first semiconductor layer, the second multilayer reflector stack at least partially covering the second semiconductor layer, wherein, in use, at least 60% of light that is generated in the light emitting region and that is incident on the second multilayer reflector stack is reflected by the second multilayer reflector stack;
a second electrode disposed on the second multilayer reflector stack and at least partially covering the second multilayer reflector stack; and, a second network of electrically conductive elements disposed in the second multilayer reflector stack, the conductive elements of the second network extending at least partially through the second multilayer reflector stack to provide an electrically conductive path between the second semiconductor layer and the second electrode;
wherein:
location, shape and transverse dimensions of the electrically conductive elements in the second network are predetermined such that light generated in the light emitting region that is incident on the second network of conductive elements is reflected and is forbidden to couple into localized or propagating surface plasmon modes associated with the second network of electrically conductive elements.

3. A light emitting device according to claim 1, wherein the refractive index of any material residing in the first multilayer reflector stack is less than or equal to the refractive index of the first and second semiconductor layers.

4. A light emitting device according to claim 1, wherein the first multilayer reflector stack comprise one or more materials selected from: Magnesium Fluoride, Silicon Dioxide, Silicon Oxynitride, Silicon Nitride, Tantalum Pentoxide, Zirconium Dioxide, Niobium Oxide, transparent metal oxides, transparent metal nitrides, ITO, nanocolumnar ITO, porous ITO, Zinc Oxide, nanocolumnar Zinc Oxide, porous Zinc Oxide, Aluminium doped Zinc Oxide, Indium doped Zinc Oxide, and Gallium doped Zinc Oxide.

5. A light emitting device according to claim 1, further comprising a first transparent layer interposed between the first multilayer reflector stack and the first semiconductor layer, the first transparent layer adapted to aid adhesion and to improve electrical conductivity between the first electrode and the first semiconductor layer.

6. A light emitting device according to claim 1, wherein the light emitting region and the first multilayer reflector stack are separated by a predetermined distance which is selected to optimize an optical cavity effect therebetween, whereby light extraction is increased as compared to the device without the optical cavity effect.

7. A light emitting module comprising;
a light emitting device according to claim 1;
a first encapsulating material disposed on at least the light extracting surface of the second semiconductor layer;
a second encapsulating material overcoating at least the first encapsulating material; and,
a phosphor material interposed between first and second encapsulating materials.

8. A method of manufacturing the light emitting device of claim 1, the method comprising the steps of:
growing each of a second semiconductor material, a light emitting region, and a first semiconductor material;
depositing a first multilayer reflector stack;
forming a first mask for producing a first network of conductive elements;
performing a pattern transfer of the first network using the first mask into the first multilayer reflector stack, wherein the pattern is configured such that light generated in the light emitting region during operation and that is incident on the first network of conductive elements is reflected and is forbidden to couple into localized or propagating surface plasmon modes associated with the first network of electrically conductive elements;
depositing the first conductive elements;
forming mesa isolation trenches to define light emitting devices;
depositing a passivation layer;
depositing a first electrode;
attaching a conductive sub-mount;
removing growth substrate;
depositing a second electrode;
roughening an outer surface of the second semiconductor layer,
separating out an isolated light emitting die.

9. A method according to claim 8, further comprising the step of depositing a first high reflectivity metal for the first multilayer reflector stack after the step of depositing the first conductive elements.

10. A method according to claim 8, further comprising the step of depositing a first transparent layer prior to the step of depositing the first electrode.

11. A method according to claim 8, wherein after the step of removing growth substrate the method further comprises the steps of:
depositing a second multilayer reflector stack;
forming a second mask for producing a second network of conductive via elements;
performing a pattern transfer of the second network using the second mask into the second multilayer reflector stack, wherein the pattern is configured such that light generated in the light emitting region during operation and that is incident on the second network of conductive elements is reflected and is forbidden to couple into localized or propagating surface plasmon modes associated with the second network of electrically conductive elements; and,
depositing the second conductive elements.

12. A light emitting device according to any one of claim 1, wherein at least a surface of the second semiconductor layer is partially roughened.

13. A light emitting device according to claim 1, wherein the combined thickness of the first and second semiconductor layers is less than 3 microns.

14. A light emitting device according to claim 1, wherein electrically conductive elements of the first network comprise conductive rod elements.

15. A light emitting device according to claim 14, wherein one or more of the conductive rod elements have a surrounding cylindrical dielectric shell of refractive index lower than the average effective refractive index of the first reflector stack.

16. A light emitting device according to claim 1, wherein electrically conductive elements of the first network comprise dielectric rod elements, each with a surrounding conductive cylindrical shell.

17. A light emitting device according to claim 1, wherein the electrically conductive elements of the first network comprise one or more transparent materials selected from: transparent conductive metal oxide, transparent conductive metal nitride, doped transparent conductive metal oxide, doped transparent conductive metal nitride, ITO, ZnO, Al doped ZnO, Ga doped ZnO, and In doped ZnO.

18. A light emitting device according to claim 1, wherein the first network of electrically conductive elements comprise interconnected conductive elements.

* * * * *